United States Patent
Dunsky et al.

(10) Patent No.: US 6,407,363 B2
(45) Date of Patent: Jun. 18, 2002

(54) LASER SYSTEM AND METHOD FOR SINGLE PRESS MICROMACHINING OF MULTILAYER WORKPIECES

(75) Inventors: Corey M. Dunsky; Ho W. Lo, both of Portland; Ken Whiteman, Aloha, all of OR (US); Donald R. Wilt, Lexington, MA (US); Spencer Barrett; Raman Sudhakar, both of Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 09/823,922

(22) Filed: Mar. 30, 2001

Related U.S. Application Data
(60) Provisional application No. 60/193,581, filed on Mar. 30, 2000.

(51) Int. Cl.$^7$ ............................................. B23K 26/00
(52) U.S. Cl. ........................ 219/121.71; 219/121.69; 219/121.8
(58) Field of Search ............... 219/121.69, 121.68, 219/121.67, 121.7, 121.71, 121.72, 121.78, 121.61, 121.62, 121.83, 121.6, 121.8, 121.29; 216/65, 66, 94; 427/554, 555, 556; 264/400

(56) References Cited

U.S. PATENT DOCUMENTS

| | | | |
|---|---|---|---|
| 4,091,274 A | 5/1978 | Angelbeck et al. | 250/201 |
| 4,146,307 A | 3/1979 | Gaffard | 350/285 |
| 4,387,966 A | 6/1983 | Holly | 350/360 |
| 4,526,686 A | 7/1985 | Sisti et al. | 210/198.2 |
| 4,592,058 A | 5/1986 | Mongeon et al. | 372/32 |
| 4,634,420 A | 1/1987 | Spinosa et al. | 604/22 |
| 4,655,563 A | 4/1987 | Plante et al. | 350/611 |
| 4,674,848 A | 6/1987 | Aldrich et al. | 350/610 |
| 4,679,915 A | 7/1987 | Kriz et al. | 350/611 |
| 4,725,144 A | 2/1988 | Nelson et al. | 356/360 |
| 4,750,818 A | 6/1988 | Cochran | 350/360 |
| 4,825,062 A | 4/1989 | Rather et al. | 250/201 |
| 4,862,029 A | 8/1989 | Kasai et al. | 310/311 |
| 4,875,764 A | 10/1989 | Marino et al. | 350/611 |
| 4,906,087 A | 3/1990 | Ealey et al. | 350/611 |
| 4,923,302 A | 5/1990 | Ealey et al. | 356/371 |
| 4,934,803 A | 6/1990 | Ealey | 350/610 |
| 4,940,318 A | 7/1990 | Ealey et al. | 350/611 |
| 4,967,063 A | 10/1990 | Wang et al. | 250/201.1 |

(List continued on next page.)

FOREIGN PATENT DOCUMENTS

| | | | | |
|---|---|---|---|---|
| DE | 4034745 A1 | 7/1991 | | B23K/26/02 |
| EP | 0976487 A1 | 2/2000 | | B23K/26/06 |

(List continued on next page.)

OTHER PUBLICATIONS

"Adaptive Optics" brochure by Diehl Stiftung Co. (Before Apr. 27, 2000).

English translation of foreign patent document disclosed on Dec. 7, 2001:EP 0976487 A1, published Feb. 2, 2000 in Europe under Class B23K, Subclass 26/06.

(List continued on next page.)

*Primary Examiner*—Tom Dunn
*Assistant Examiner*—Jonathan Johnson
(74) *Attorney, Agent, or Firm*—Stoel Rives LLP

(57) ABSTRACT

A single pass actuator (70, 200), such as a deformable mirror (70), quickly changes, preferably in less than 1 ms, the focus and hence the spot size of ultraviolet or visible wavelength laser pulses to change the fluence of the laser output (66) at the workpiece surface between at least two different fluence levels to facilitate processing top metallic layers (264) at higher fluences and underlying dielectric layers (266) at lower fluences to protect bottom metallic layers (268). The focus change is accomplished without requiring Z-axis movement of the laser positioning system (62). In addition, the spot size can be changed advantageously during trepanning operations to decrease via taper, reduce lip formation, increase throughput, and/or minimize damage.

90 Claims, 15 Drawing Sheets

U.S. PATENT DOCUMENTS

| | | | |
|---|---|---|---|
| 5,051,571 A | 9/1991 | Brown, Jr. et al. | 250/201.9 |
| 5,063,280 A | 11/1991 | Inagawa et al. | 219/121.7 |
| 5,073,687 A | 12/1991 | Inagawa et al. | 219/121.7 |
| 5,101,091 A | 3/1992 | Grub et al. | 219/121.74 |
| 5,208,818 A | 5/1993 | Gelbart et al. | 372/30 |
| 5,210,653 A | 5/1993 | Schell | 359/846 |
| 5,229,889 A | 7/1993 | Kittell | 359/849 |
| 5,229,951 A | 7/1993 | Sugita et al. | 364/474.29 |
| 5,293,094 A | 3/1994 | Flynn et al. | 310/323 |
| 5,396,364 A | 3/1995 | O'Meara et al. | 359/292 |
| 5,414,564 A | 5/1995 | Pausch et al. | 359/846 |
| 5,453,594 A | 9/1995 | Konecny | 219/121.61 |
| 5,469,302 A | 11/1995 | Lim | 359/846 |
| 5,585,018 A * | 12/1996 | Kanaoka et al. | 219/121.61 |
| 5,593,606 A | 1/1997 | Owen et al. | 219/121.71 |
| 5,596,185 A | 1/1997 | Bross et al. | 250/208.1 |
| 5,610,707 A | 3/1997 | Duncan et al. | 356/121 |
| 5,667,707 A | 9/1997 | Klingel et al. | 219/121.67 |
| 5,731,047 A | 3/1998 | Noddin | 427/555 |
| 5,751,585 A | 5/1998 | Cutler et al. | 364/474.03 |
| 5,754,219 A | 5/1998 | Rückl | 347/256 |
| 5,768,007 A | 6/1998 | Knipe et al. | 359/290 |
| 5,777,807 A | 7/1998 | Bar et al. | 359/845 |
| 5,790,156 A | 8/1998 | Mutton et al. | 347/71 |
| 5,841,099 A | 11/1998 | Owen et al. | 219/121.69 |
| 5,849,125 A | 12/1998 | Clark | 156/222 |
| 5,889,256 A | 3/1999 | Osanai | 219/121.74 |
| 5,907,441 A | 5/1999 | Sapy | 359/849 |
| 5,914,507 A | 6/1999 | Polla et al. | 257/254 |
| 6,031,201 A * | 2/2000 | Amako et al. | 219/121.68 |
| 6,100,498 A | 8/2000 | Nakata | 219/121.72 |
| 6,118,570 A | 9/2000 | Kanai et al. | 359/210 |
| 6,180,914 B1 * | 1/2001 | Jones et al. | 131/360 |
| 6,191,382 B1 * | 2/2001 | Damikolas | 156/272.8 |
| 6,211,488 B1 * | 4/2001 | Hoekstra et al. | 219/121.67 |
| 6,266,314 B1 * | 7/2001 | Fukakusa et al. | 369/112.01 |

FOREIGN PATENT DOCUMENTS

| | | | |
|---|---|---|---|
| JP | 3128187 | 5/1991 | B23K/26/06 |
| JP | 3174995 | 7/1991 | B23K/26/06 |
| JP | 5-208288 | 8/1993 | B23K/26/00 |
| WO | WO 99/63793 | 12/1999 | H05K/3/00 |

OTHER PUBLICATIONS

English translation of foreign patent document disclosed on Dec. 7, 2001: DE 4034745 A1, published Jul. 18, 1991 in Germany under Class B23K, Subclass 26/02.

European Search Report, dated Nov. 26, 2001, concerning corresponding International Application No. PCT/US01/10391.

* cited by examiner

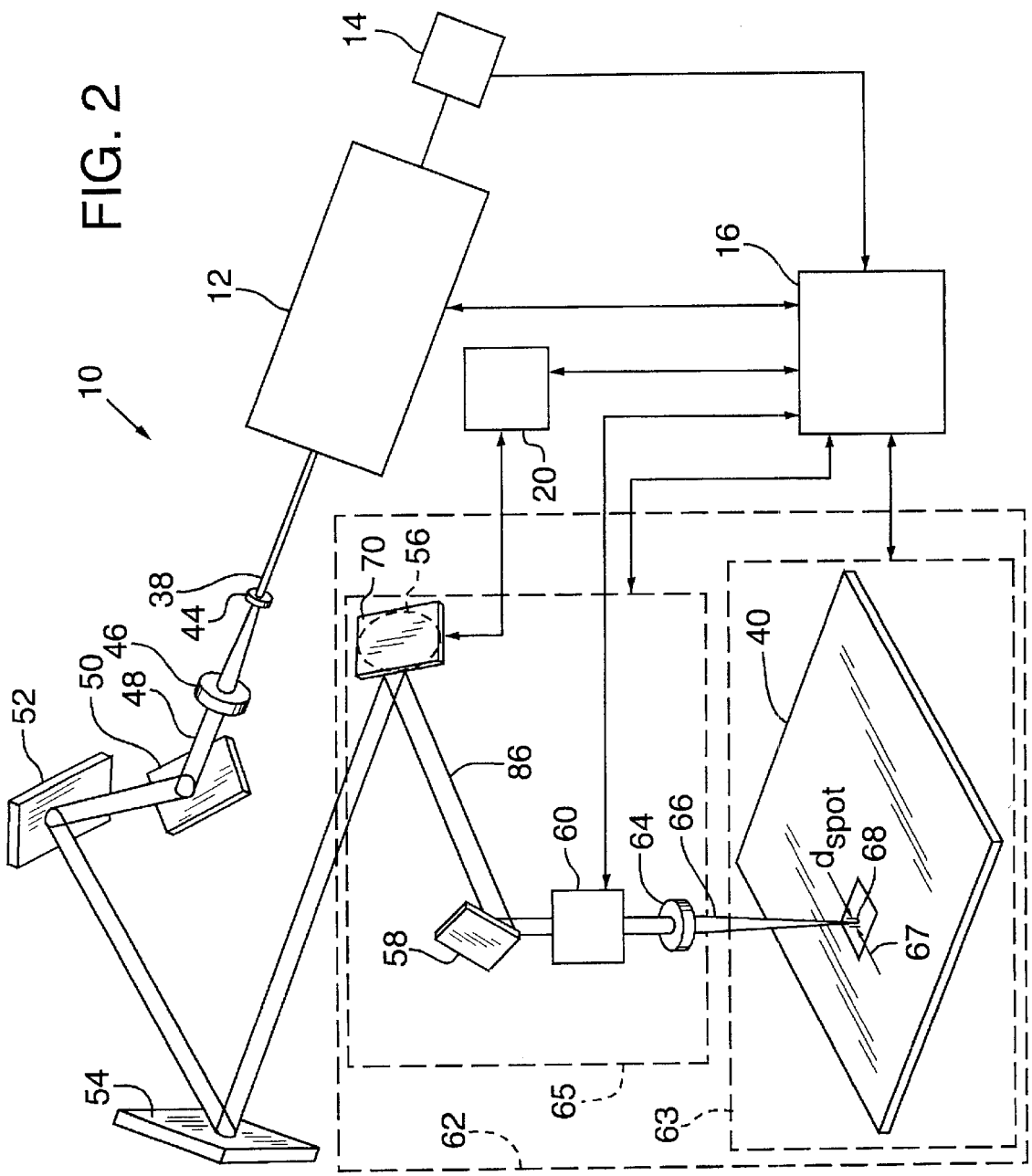

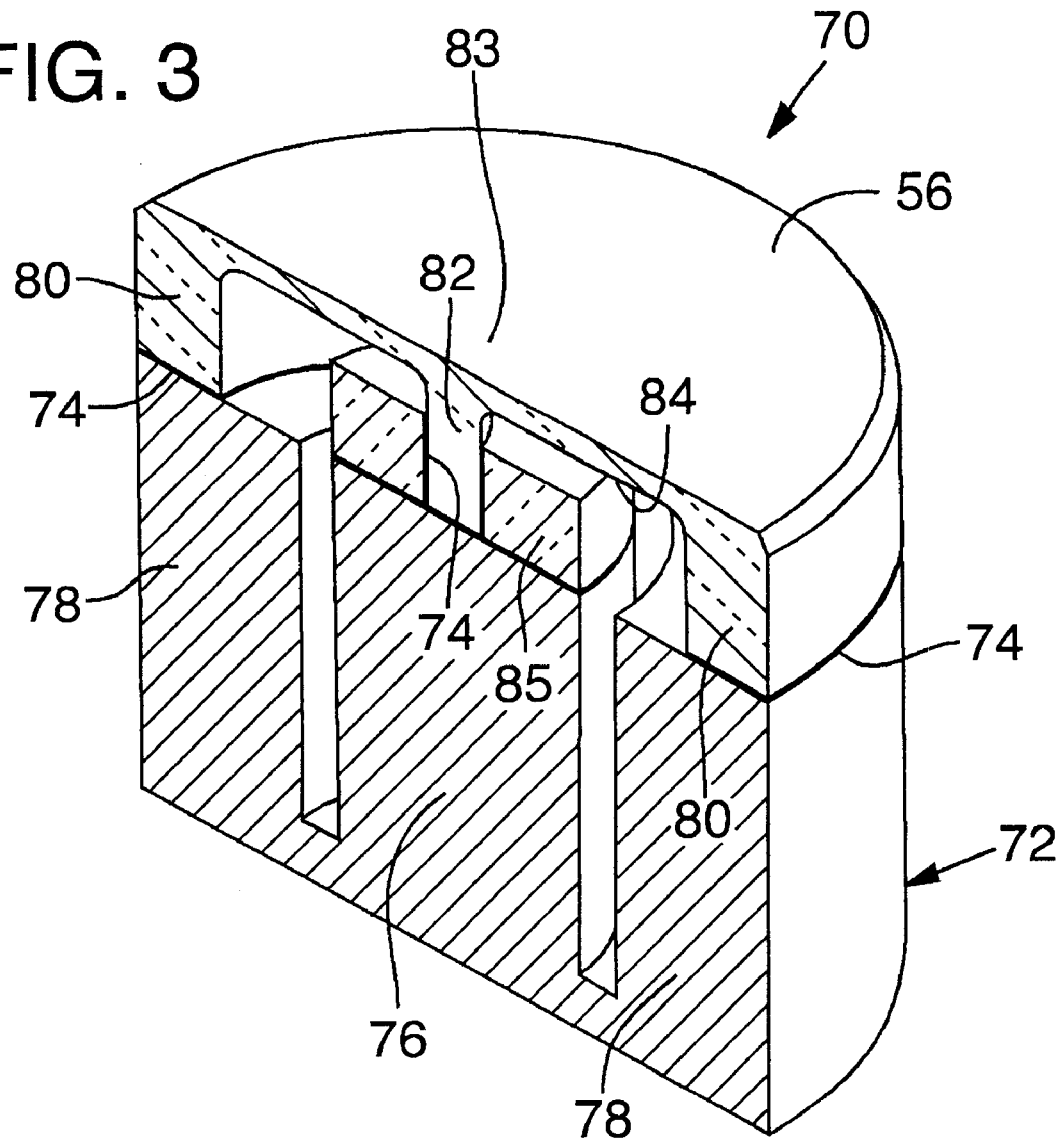

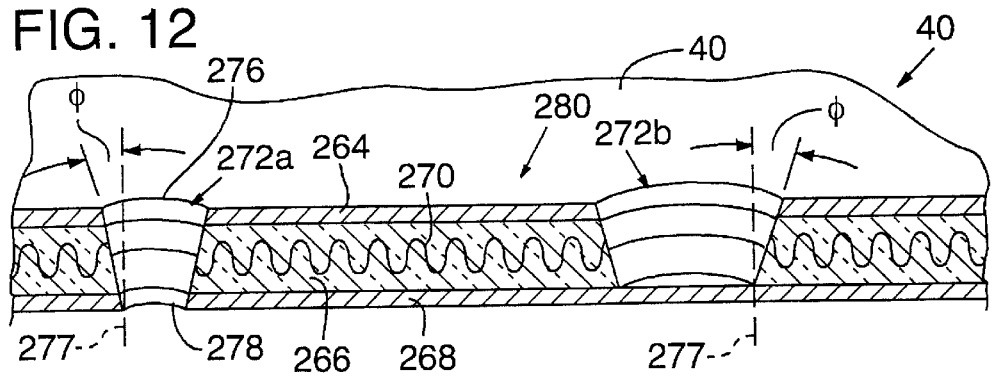
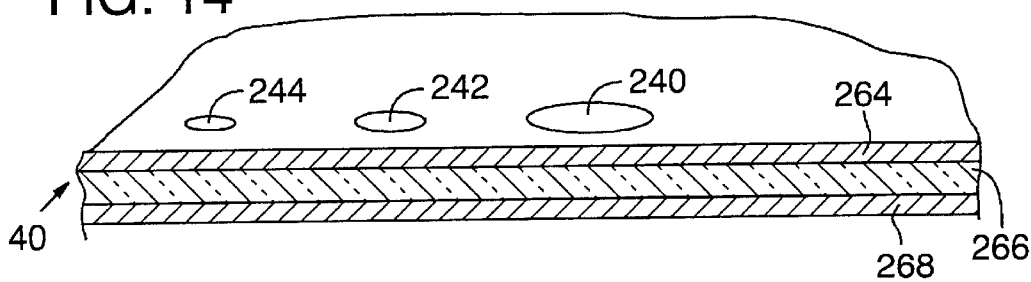
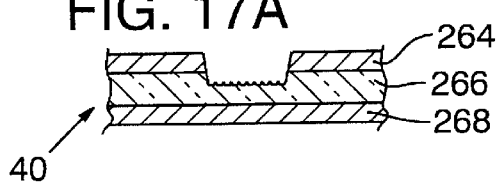 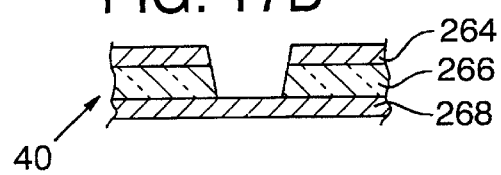
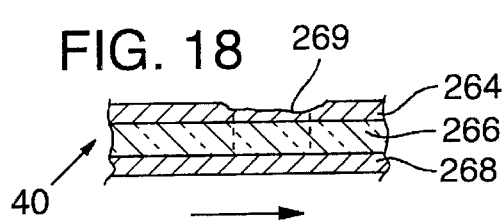 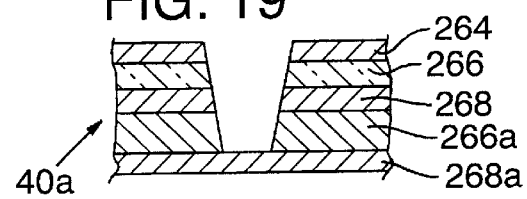
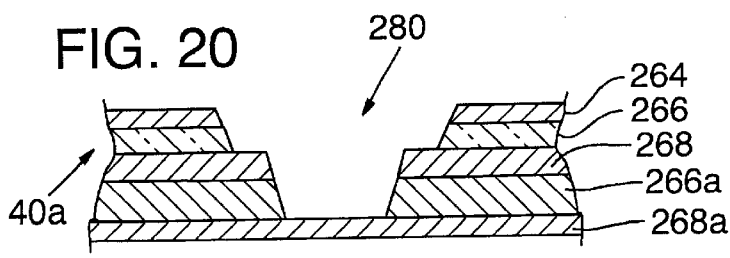

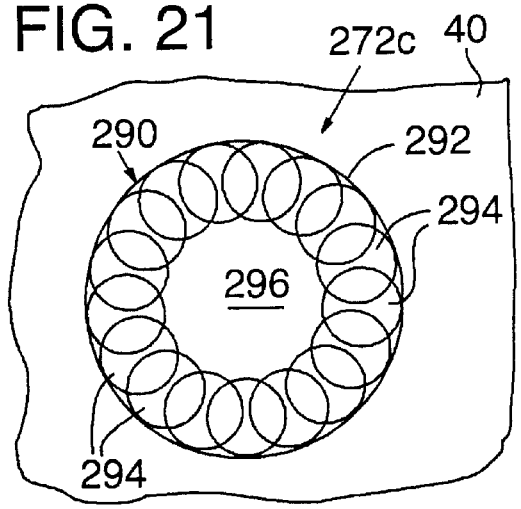
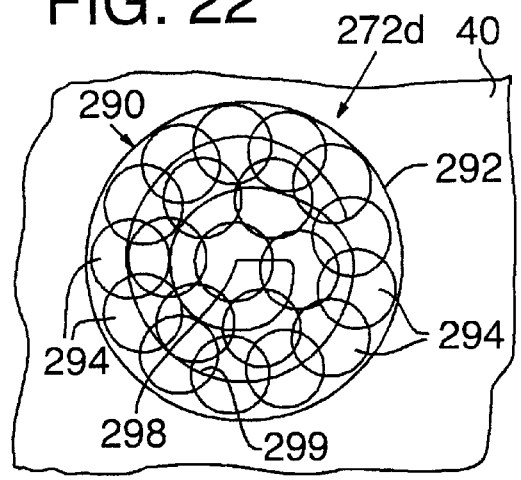
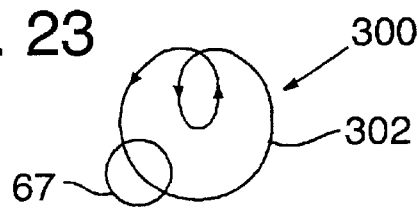
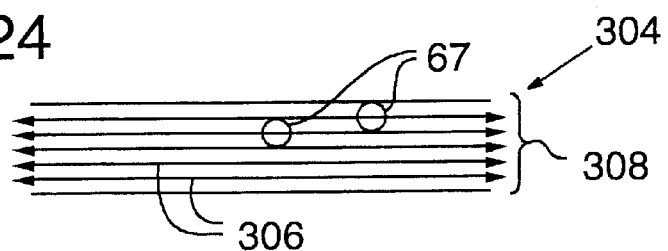
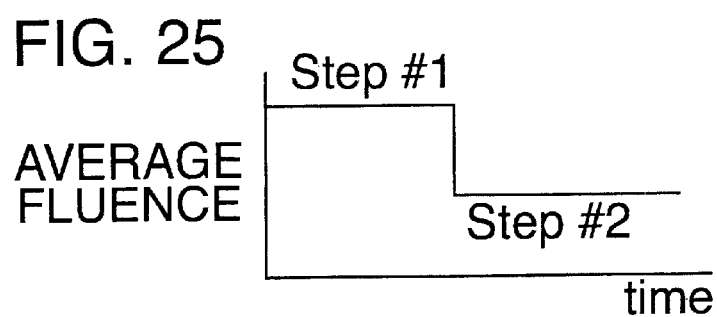

LASER SYSTEM AND METHOD FOR SINGLE PRESS MICROMACHINING OF MULTILAYER WORKPIECES

This patent application derives priority from U.S. Provisional Application No. 60/193,581, filed Mar. 30, 2000.

TECHNICAL FIELD

The present invention relates to laser micromachining and, in particular, to a method and apparatus employing a single pass actuation (SPA) assembly to vary the power density of ultraviolet laser output applied to a target surface during processing of multilayer workpieces having at least two layers with different absorption characteristics in response to ultraviolet light.

BACKGROUND OF THE INVENTION

The background is presented herein only by way of example to multilayer electronic workpieces, such as integrated-circuit chip packages, multichip modules (MCMs) and high-density interconnect circuit boards, that have become the most preferred components of the electronics packaging industry.

Devices for packaging single chips such as ball grid arrays, pin grid arrays, circuit boards, and hybrid microcircuits typically include separate component layers of metal and an organic dielectric and/or reinforcement materials, as well as other new materials. A standard metal component layer typically has a depth or thickness of greater than 5 µm, a standard organic dielectric layer typically has a thickness of greater than 30 µm, and a standard reinforcement component "layer" typically has a thickness of greater than 5 µm disbursed throughout the dielectric layer. Stacks having several layers of metal, dielectric, and reinforcement material are often thicker than 2 mm.

Much recent work has been directed toward developing laser-based micromachining techniques to form vias in, or otherwise process, these types of electronic materials. Vias are discussed herein only by way of example to micromachining and may take the form of complete through-holes or incomplete holes called blind vias. Unfortunately, laser micromachining encompasses numerous variables including laser types, operating costs, and laser- and target material-specific operating parameters such as beam wavelength, power, and spot size, such that the resulting machining throughputs and hole quality vary widely.

In U.S. Pat. No. 5,593,606, Owen et al. describe advantages of employing UV laser systems to generate laser output pulses within advantageous parameters to form vias through at least two layers of multilayer devices. These parameters generally include nonexcimer output pulses having temporal pulse widths of shorter than 100 ns, spot areas with spot diameters of less than 100 µm, and average intensities or irradiances of greater than 100 mW over the spot areas at repetition rates of greater than 200 Hz.

In U.S. Pat. No. 5,841,099, Owen et al. vary laser output within similar parameters to those described above to have different power densities while machining different materials. They change the intensity by changing the laser repetition rate and/or the spot size. In one embodiment, they employ a first laser output of a high intensity to ablate a metallic layer and a second laser output of lower intensity to ablate an underlying dielectric layer so a lower metal layer can act as a laser etch stop in blind via operations.

In one implementation, Owen et al. change spot size by raising and lowering the objective lens to change the energy density of the laser spot impinging upon the, workpiece. In most conventional laser systems, changing the height of the objective lens is a slow process because moving the vertical (Z) stage requires at least several hundred milliseconds (ms).

In another implementation, Owen et al. change the repetition rate of the laser to change the energy density of the laser spot impinging the workpiece. However, for a given laser power, if the energy per pulse is decreased, for example, by increasing the repetition rate, then more pulses and consequently more time is needed to apply the total energy that must be delivered to the workpiece to drill the via. Thus, this implementation also generally impacts throughput.

Even within the parameters established by Owen et al., skilled persons would need to further tailor the repetition rate changes and other process parameters to suit particular workpieces to produce vias meeting all the criteria for quality, including the via wall taper, the degree of melting of the copper layer at the bottom of the via, and the height of the "rim" around the periphery of the via caused by the splash of molten copper during drilling. These parameters are difficult to optimize for throughput as well as for all the criteria for quality.

Because these energy density changing methods are time consuming or complex, the conventional process for machining through multilayer devices is typically at least a two pass operation. Such two pass operations involve sequentially removing a first layer of a first material at all of the desired target locations at a first energy density. Once all of the holes are made through the first layer, the spot size and/or repetition rate is changed to achieve a second energy density, which is then used to remove a second layer of a second material at all of the desired target locations.

The major disadvantage of such two pass operations is that the typical hole-to hole move time of 2–10 ms is relatively slow and each hole must be addressed twice, resulting in a total via formation time of 4–20 ms plus actual drilling time. FIG. 1 shows a best-case conventional time line for a double-pass, two-step via drilling process, assuming a hole drilling time of 2 ms and a 2 ms move time.

A faster and more reliable way of changing the energy density of laser output between first and second layer machining operations is therefore desirable.

SUMMARY OF THE INVENTION

An object of the present invention is, therefore, to provide a method or apparatus for quickly changing the energy density of laser output to facilitate machining of workpieces.

Another object of the invention is to improve the throughput of workpieces in such laser machining operations.

A further object of the invention is to facilitate one-pass processing of workpieces.

Changing the laser spot size is more practical than changing the repetition rate to alter the energy density because if a laser system decreases the power density by maintaining the energy per pulse but spreading it out over a larger laser spot area, the laser system can apply the same total energy with fewer pulses. Hence, the system can process the workpieces faster. The present invention preferably, therefore, conserves the total energy per pulse and employs a system or method that rapidly changes the area of the laser spot impinging upon the workpiece. By changing the laser spot size in a period of less than a few milliseconds, the present invention can eliminate the conventional second pass of hole-to-hole moves, and the throughput of the overall process can be substantially increased.

The present invention employs a single pass actuation assembly to change the energy density of laser output pulses between at least two different values to facilitate processing different layers at different energy densities. In a preferred embodiment of the present invention, a deformable mirror permits a quick, preferably less than one millisecond, change of focus of UV laser output to change the spot size of the focused beam waist and hence its energy density without requiring Z-axis movement of the laser positioning system.

Deformable mirrors have been employed as adaptive optics for IR- and visible-wavelength lasers in astronomy and climatology applications to compensate for atmospheric turbulence in order to keep the fluence constant.

In U.S. Pat. No. 5,667,707, Klingel et al. employ a laser system with a deformable mirror to cut or weld metal of huge panels having surfaces that are not particularly flat. Their laser operation requires a high-energy tightly-focused laser spot to efficiently process the metal target. They employ the deformable mirror to change the focus height of the laser spot to maintain the size of the laser spot at the target surface regardless of its flatness and hence maintain the laser spot's high fluence throughout the metal processing operation. The deformable mirror has a soft surface whose curvature is manipulated by varying fluid pressure. The mirror response time is relatively slow.

A preferred deformable mirror employs a flexible face sheet made from an optically flat and coated machined piece of glass or other common optical substrate that is rigidly attached to two concentric circles of an electrostrictive actuator, preferably made of PMN (lead magnesium niobate). The outer circle of the actuator is active and increases in length with applied voltage. The inner circle is not connected to power and is therefore inactive. Whenever a voltage is applied to the actuator, the outer PMN material expands, pushing on the outer rim of the face sheet while the inner PMN material holds the center of the face sheet firmly in position. The resulting surface contour of the face sheet is concave. The back of the face sheet is machined such that the active concave surface contour is smooth and continuous and has the correct optical figure over its clear aperture so the reflected beam wavefront is precisely spherical. The use of the PMN electrostrictive actuator allows focus changes to be accomplished in less than about 0.5 ms.

Other embodiments may employ galvanometer-driven mirrors to divert the laser beam to an alternative focal path to change the size of the laser spot area.

Additional objects and advantages of this invention will be apparent from the following detailed description of preferred embodiments thereof which proceeds with reference to the accompanying drawings.

BRIEF DESCRIPTION OF THE DRAWINGS

FIG. 2 is an isometric view of a simplified laser system incorporating a deformable mirror in accordance with present invention.

FIG. 3 is an isometric sectional view of a deformable mirror mechanism employed in the laser system of FIG. 2 and depicting a mirror face sheet in an inactive shape.

FIG. 12 is an enlarged sectional side elevation view of a multilayered workpiece having a through-hole and a blind via.

FIG. 14 is a diagram that shows qualitatively the differences in spot size that correspond to different distances between the workpiece and the laser beam focal plane.

FIGS. 17A and 17B are fragmentary cross-sectional views showing the sequential steps carried out to form a depthwise self-limiting blind via of a workpiece composed of a layer of dielectric material positioned between a top conductor layer and a bottom conductor layer.

FIG. 18 is a fragmentary cross-sectional view of an incomplete top layer opening for a via that can be machined in accordance with the present invention.

FIG. 19 is a fragmentary cross-sectional view of a workpiece that is similar to the workpiece of FIGS. 17A and 17B but has a second dielectric layer positioned between conductor layers.

FIG. 20 is a fragmentary cross-sectional view of the workpiece of FIG. 19 but with a blind via characterized by a depthwise-stepped width of increasing diameter from a top conductor layer to a bottom conductor layer.

FIGS. 21 and 22 show cutting profiles for forming a through-hole and a blind via, respectively.

FIG. 23 is an alternative trepanning profile for forming a blind via.

FIG. 24 is a conventional line-cutting profile.

FIG. 25 is an exemplary fluence versus time profile.

DETAILED DESCRIPTION OF PREFERRED EMBODIMENT

Figure 1:
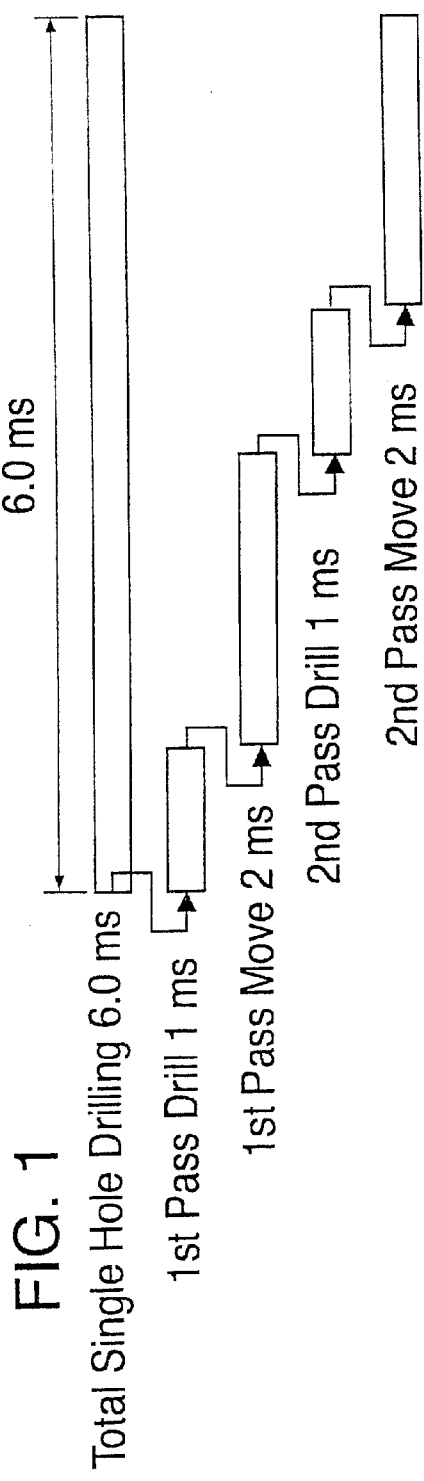
FIG. 1 is a conventional time line for a double-pass, two-step via drilling process.

With reference to FIG. 2, a preferred embodiment of a laser system 10 of the 25 present invention includes Q-switched, diode-pumped (DP), solid-state (SS) laser 12 that preferably includes a solid-state lasant such as Nd:YAG, Nd:YLF, Nd:YAP, or Nd:YVO$_4$, or a YAG crystal doped with holmium or erbium. Laser 12 preferably provides harmonically generated laser output 38 of one or more laser pulses at a wavelength shorter than 550 nm such as about 532 nm, and preferably shorter than 400 nm such as 355 nm (frequency tripled Nd:YAG), 266 nm (frequency quadrupled Nd:YAG), or 213 nm (frequency quintupled Nd: YAG), with primarily a TEM$_{00}$ spatial mode profile. Lasers 12 and harmonic generation techniques are well known to skilled practitioners. Details of one exemplary laser 12 are described in detail in U.S. Pat. No. 5,593,606 of Owen et al. Skilled persons will also appreciate that other pumping sources, such as a krypton arc lamp, or other wavelengths are available from the other listed lasants. The pumping diodes, arc lamp, or other conventional pumping means receive power from a power supply 14.

With reference to FIG. 2, laser output 38 may be manipulated by a variety of well-known optics including beam expander lens components 44 and 46 that are positioned along beam path 48 before being directed by a series of beam-directing reflectors 50, 52, and 54 (such as Z, Y, and X positioning mirrors), flexible mirror face sheet 56, turn mirror 58, and fast positioner 60 (such as a pair of galvanometer mirrors) of beam positioning system 62. Finally, laser output 38 is passed through a focusing lens 64 before being applied as processing output beam 66 with laser spot 67 at workpiece 40.

A preferred beam positioning system 62 is described in detail in U.S. Pat. No. 5,751,585 of Cutler et al. and may include ABBE error correction means described in U.S. patent application Ser. No. 09/755,950, filed Jan. 5, 2001, of Cutler. Beam positioning system 62 preferably employs a translation stage positioner that preferably controls at least two platforms or stages 63 and 65 and supports positioning components 56, 58, and 60 to target and focus processing output beam 66 to a desired laser target position 68. In a preferred embodiment, the translation stage positioner is a split-axis system where a Y stage 63, typically moved by linear motors, supports and moves workpiece 40, an X stage 65 supports and moves fast positioner 60 and objective lens 64, the Z dimension between the X and Y stages is adjustable, and beam-directing reflectors 50, 52, and 54 align the beam path 64 through any turns between laser 12 and flexible sheet 56. Beam positioning system 62 permits quick movement between target positions 68 on the same or different circuit boards or chip packages to effect unique or duplicative processing operations based on provided test or design data.

A laser system controller 16 preferably synchronizes the firing of laser 12 to the motion of stage 63 and 65 and fast positioner 60 in a manner well known to skilled practitioners. One example of such coordination is described in U.S. Pat. No. 5,453,594 of Konecny for Radiation Beam Position and Emission Coordination System. Laser system controller 16 is shown generically to control fast positioner 60, stages 63 and 65, power supply 14, laser 12, and-DMM controller 20. Skilled persons will appreciate that laser system controller 16 may include integrated or independent control subsystems to control and/or provide power to any or all of these laser components and that such subsystems may be remotely located with respect to laser system controller 16.

An example of a preferred laser system 10 that contains many of the above-described system components employs a Model 210 UV-3500 laser sold by Lightwave Electronics of Mountain View, Calif. in a Model 5320 laser system or others in its series manufactured by Electro Scientific Industries, Inc. (ESI) in Portland, Oregon. Skilled persons will also appreciate that a system with a single X-Y stage for workpiece positioning and a fixed beam position and/or stationary galvanometer for beam positioning may alternatively be employed.

Laser system output beam 66 preferably produces a spot area 67 of diameter, $d_{spot}$, at target position 68 on workpiece 40. Although spot area 67 and $d_{spot}$ generally refer to 1/$e^2$ dimensions, especially with respect to the description of laser system 10, these terms are occasionally used to refer to the spot area or diameter of the hole created by a single pulse or the width of a kerf created in a single pass of pulses.

FIG. 3 is an isometric sectional view of a deformable mirror mechanism (DMM) 70 that employs an actuator 72 that supports and creates a shape change in flexible sheet 56, which is preferably made from an optically flat piece of glass or similar material. In a preferred embodiment, flexible sheet 56 is rigidly attached by a UV resistant adhesive 74, such as epoxy, to inner and outer concentric zones 76 and 78 of a ferroelectric ceramic actuator material, such as PMN. The electrostrictive PMN actuator material has high electromechanical conversion efficiency, exhibits wide operating and manufacturing temperature ranges, does not require permanent polarization, and provides useful mechanical activity with small electrical drive voltages.

Although a piezoelectric-type (PZT) actuator 72 could be employed, PMN material is preferred because it avoids silver migration, which is a function of field effect and humidity, that is common with PZT actuators 72. Thus, the PMN material does not creep with time and requires no re-calibration, so once flexible sheet 56 has been assembled and polished, it will remain flat, for example, without an offset voltage. Furthermore, it is likely that a suitable PZT actuator 72 would last only 25% (about one year) as long as a suitable PMN actuator. In addition to PZT actuators, skilled persons will appreciate that any precision high-bandwidth actuators 72 such as voice coils could be employed for DMM 70. Skilled persons will appreciate that flexible face sheet 56 could be actuated by a small array of DMMs 70, such as 6-9 DMMs 70, to provide greater control. Such arrays would, however, typically employ closed loop feedback and would be more expensive to implement for the model 53xx and 54xx laser systems of ESI.

Figure 4:
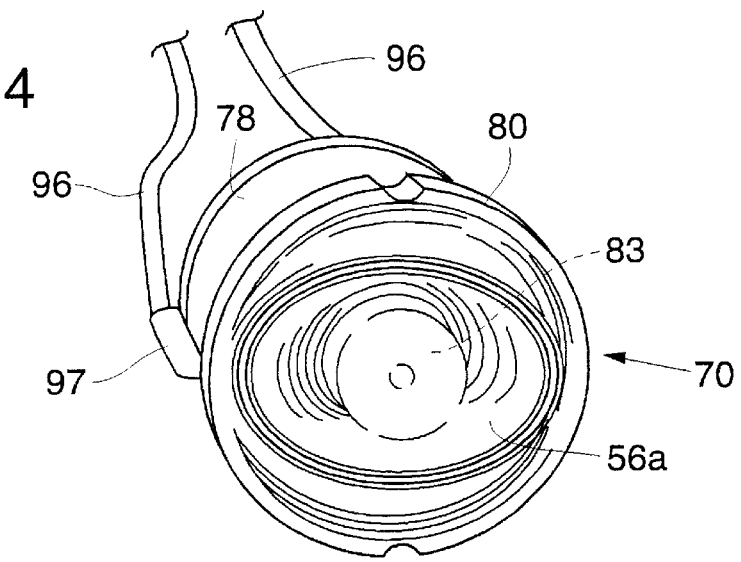
FIG. 4 is a frontal view of the deformable mirror mechanism that depicts the flexible sheet in an active shape.

FIG. 4 is a frontal view of DMM 70 that depicts flexible sheet 56 in an activated shape. With reference to FIGS. 3 and 4, in a preferred embodiment, outer zone 78 of actuator 72 is active and increases in length with applied voltage, and inner zone 76 is not connected to power and is therefore always inactive. Whenever a voltage is applied to outer zone 78, its PMN material expands, pushing on the outer rim 80 of flexible sheet 56 while the inner PMN material 82 holds center 83 of flexible sheet 56 firmly in position. The resulting active surface contour of flexible sheet 56 is concave. Backside 84 of flexible sheet 56 is machined such that the active concave surface contour is smooth and continuous and has the correct optical figure over its clear aperture so the wave front of reflected beam 86 is precisely spherical. Actuator 72 allows focus changes to be accomplished in less than about 2 ms, preferably less than 1 ms, and most preferably less than 0.5 ms.

Figure 5:
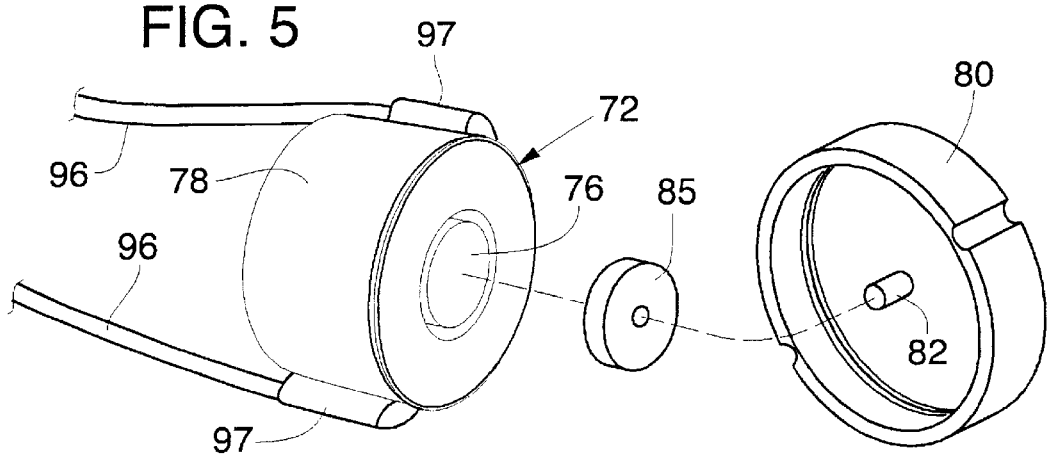
FIG. 5 is an exploded view of actuator parts forming part of the deformable mirror mechanism of FIG. 3.

FIG. 5 is an exploded view of actuator parts forming part of DMM 70. With reference to FIGS. 3–5, single crystal silicon (Si), fused silica, or fused silica/ ULE™ (ultra low expansion-UV grade) are preferred options for the material of flexible sheet 56 and collar 85. Fused silica transmits 355 nm light that might damage the adhesive or actuator 72 if coatings on flexible sheet 56 are not 100% reflective. Silicon crystal absorbs 355 nm light. Fused silica/ ULE™ is a good choice for applications exposed to large temperature changes. A highly transmissive flexible sheet 56 minimizes the chances of absorbing any radiation that passes through the reflective coatings and incurring heat absorption damage that could affect the beam size (and hence its intensity), beam shape, or beam position. Skilled persons will appreciate that other suitable materials could be employed, or they can be particularly selected for use at a different wavelengths of interest, such as 266 nm.

In a preferred embodiment, flexible sheet 56 is coated to provide a reflectivity of at least 99% at 355 nm and protect actuator 72 from laser energy damage. Because bare glass has only a 4% reflectivity at 355 nm, the reflectivity is brought up from 4% to 99% with many layers of dielectric coating. However, if aluminum (Al), which is 85% reflective to 355 nm, is used as a base coating layer, then fewer dielectric layers can be employed to increase the reflectance from 85% to 99%. A preferred dielectric coating includes 5–20 layers of $SiO_2$ and 5–20 layers of $Ta_2O_5$, has a total a thickness of about 1–4 μm, and is applied at about 140 to 170° C. by ion assisted deposition. The coatings provide good durability against mechanical damage from deformation as well as low absorption so adhesive 74 and actuator 72 are not significantly exposed to the UV light. Other coating preparations are well known to skilled practitioners and can be selected to facilitate the use of different wavelengths such as 266 nm.

In a preferred embodiment, deformable mirror mechanism 70 has an operational temperature range of about 40° C. This range includes a wide range around typical room temperature, but can be made wider if temperature feedback is used. PMN actuator material is sufficiently stable that DMM 70 can be operated in an open-loop control mode. However, due to possible deformation caused by temperature changes (such as a 2% change in stroke per 1° C. at operating temperatures), DMM 70 may include an internal temperature sensor that permits compensation for stroke changes due to temperature effects. If an Si flexible sheet 56 absorbs 1% of 3 watts, the temperature of DMM 70 could increase by 0.04° C.

The preferred DMM 70 is also adapted to withstand 30 milliwatts (mW) or greater of laser energy. If, for example, the dielectric coating reflects 99% of the beam and flexible sheet 56 passes all of the unreflected energy, then DMM 70 will be exposed to a fraction of the 30 mW proportional to its surface area. Coating the backside of flexible sheet 56 with aluminum is one preferred method for absorbing the laser light and protecting actuator 72 and adhesive 74. At 99% reflectivity, the 30 mW of heat from a 3-W laser beam and/or air temperature variation could cause thermal expansion which could affect flatness. The actuator position can thus be adjusted to compensate for any such temperature related effects to flatness.

Deformable mirror mechanism 70 has dimensions that are preferably less than about 50 mm×50 mm×25 mm, and most preferably less than about 25 mm×25 mm×6 mm. In a preferred laser system 10, DMM 70 is mounted above fast positioner 60 on the X positioning stage and replaces the 90 degree turn mirror of some conventional beam positioning systems.

Precise alignment of DMM 70 to beam path 48 is desirable as it is for conventional mirrors in beam path 48. In particular, it is preferable to align DMM 70 so that center 83 of flexible face sheet 56 is in the center of beam path 48 than to align the center of beam path 48 to hit center 83 of flexible face sheet 56.

A variety of factors affect the ability of beam path 48 to strike center 83 of flexible sheet 56. For example, if beam path 48 is not parallel to the motion of X-stage 65, a change in X will cause a lateral displacement in the beam path 48 relative to flexible sheet 56. In addition, misalignment of beam path 48 from center 83 of flexible sheet 56 can cause the position of output beam 66 on the surface of workpiece 40 to shift when flexible sheet 56 is actuated.

Figure 6:
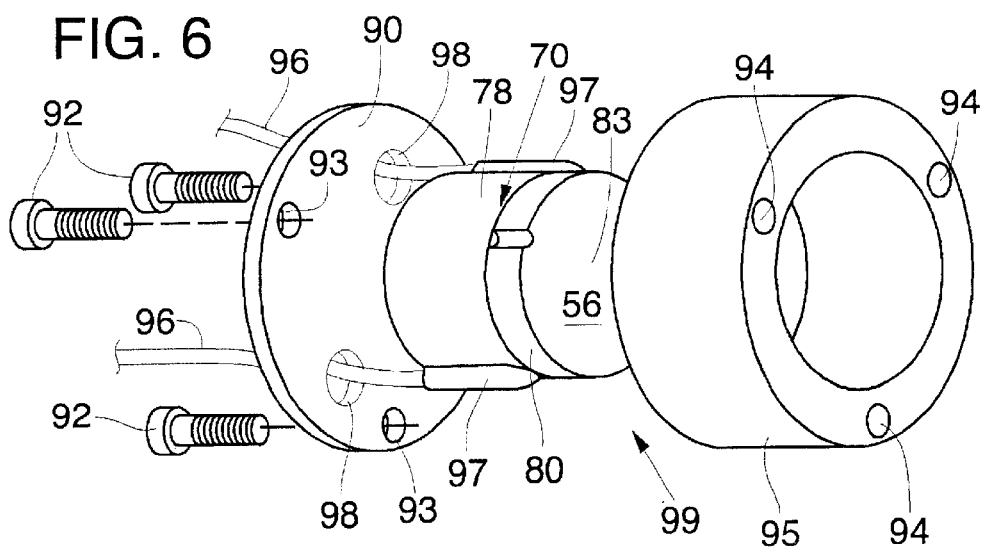
FIG. 6 is an exploded view of an actuator housing.
Figure 7:
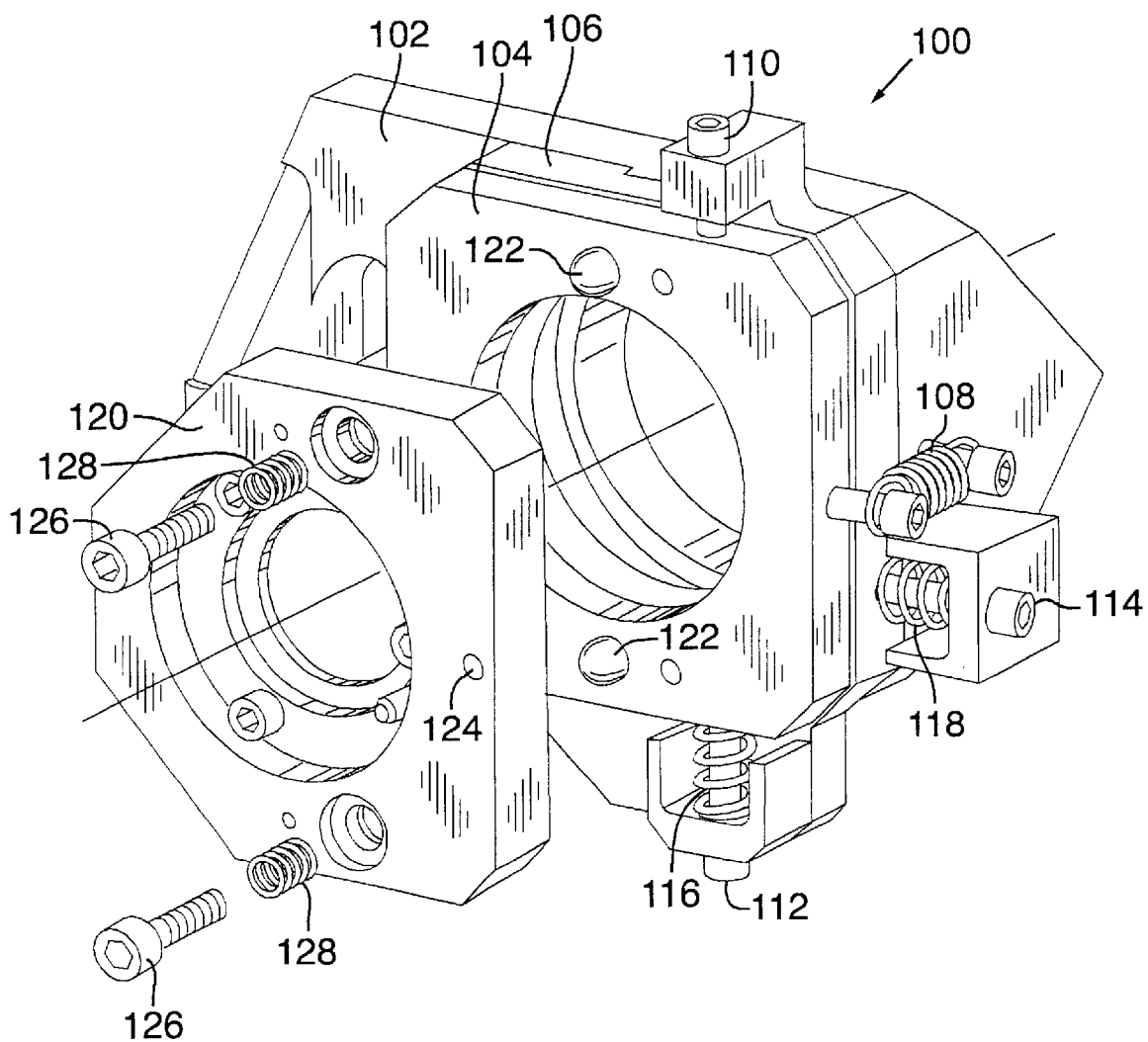
FIG. 7 is a partly exploded isometric view of a mounting assembly employed to align the deformable mirror mechanism within a beam path.

FIG. 6 is an exploded view of a preferred actuator housing 88, and FIG. 7 is a partly exploded view of a preferred mounting assembly 100 that is employed to support and align DMM 70. With reference to FIGS. 5–7, actuator 72 is preferably mounted with epoxy to an invar plate 90, and bolts 92 are bolted through plate holes 93 to holes 94 in actuator frame 95. Power control wires 96, which are connected to actuator 72 at terminals 97, are fed through plate holes 98. Power supplied through control wires 96 is responsive to commands from DMM controller 20.

Actuator housing 99, including plate 90 and frame 95, is then mounted within mounting assembly 100 having a mounting base 102. Although a conventional turn mirror has only a pitch and yaw adjustment, mounting assembly 100 is preferably also provided with an X/Y translation adjustment to facilitate alignment of flexible sheet center 83 with beam path 48. Mounting assembly 100 thus preferably has four degrees of freedom, two for laser alignment and two for centering flexible sheet 56 within beam path 48. The first two degrees of freedom are translation in the X and Y axes of positioning system 62. Along both the X and Y axes, mounting assembly 100 has an adequate range of adjustment, such as +/−6 mm, to accommodate maximum positional tolerances of the beam position as directed by the other components of positioning system 62. Both X plate 104 and Y plate 106 move along ball bearings in grooves between them. The X and Y plates 104 and 106 have retaining screws 110 and translation adjustment screws 112 and 114 that are loaded by extension springs 116 and 118 for easy adjustment. Retaining screws 110 and adjustment screws 112 and 114 also act to prevent mounting assembly 100 from separating under extreme loads. The total weight of assembly 100 is preferably low enough so that its mass contribution to X stages 65 does not adversely affect desired acceleration and deceleration of the total mass of X stage 65. An exemplary weight for assembly 100 is less than about 200 grams. Assembly 100 is held securely in the event that X stage 65 hits a limit and experiences high decelerations.

Rotation plate 120 has grooves for mounting over ball bearings 122 to provide flexible sheet center 83 with the two degrees of freedom of angular rotation with respect to the X and Y axes. Adjustment screws 124 and preload screws 126 and springs 128 lock and pre-load rotation plate 120. Other kinematic mounting assemblies could be employed and are well within the knowledge of skilled practitioners.

For alignment, first the two X and Y rotational adjustments are made to align the laser, then center 83 of flexible sheet 56 is aligned to the center of beam path 48. Flexible sheet 56 can be actuated and relocated to focus the beam spot. Mounting assembly 100 in conjunction with a beam path alignment procedure allows beam path 48 to be aligned so that less than +/−10 μm of shift is realized over the full travel length of X stage 65. Such a full travel length shift may result in a typical displacement that is less than 1 μm and is comparable to or less than high-frequency random beam positioning variations of pulse to pulse from a Q-switched laser. Because the spot diameter in many applications is about 100 μm at maximum defocus, this maximum positioning error is inconsequential. When desirable, however, skilled practitioners can select application parameters to compensate for this error.

In a preferred embodiment, mounting assembly 100 is adapted for easy upgrade of existing lasers and positioning systems 62, such as employed in models 5200 or 5320 manufactured by Electro Scientific Industries, Inc. of Portland Oregon, and can be easily exchanged for the 90 degree turn mirror on X stage 65 of conventional laser systems.

In a preferred embodiment, beam path 48 preferably strikes flexible sheet 56 at a 45 degree angle and then travels through the galvanometer mirror scanners of fast positioner 60 and the objective lens 64. For laser drilling operations, a preferred objective lens focal length is about 50–100 mm, and a preferred distance from the flexible mirror face sheet 56 to objective lens 64 is as small as practical within design constraints and preferably less than about 300 mm when the Z-stage (not shown) is at its normal focus height.

When the flexible sheet 56 is flat, it has a clear aperture that is large enough to accommodate the desired size of the laser spot and is preferably about 5–10 mm at a 45 degree angle of incidence, and the reflected beam 86 remains collimated. When the flexible sheet 56 is actuated, the mirror surface becomes concave in an elliptical fashion (to compensate for 45 degree beam incidence) and causes the beam to converge proportionately to the radius of the mirrored surface. From an applications standpoint, it is more desirable to have the beam undistorted when focused than when unfocused. Therefore, the flexible sheet 56 is preferably flat when an in focus output beam 66 is applied to workpiece 40 and is preferably concave when an out of focus output beam 66 is applied to workpiece 40. When flat, deformable mirror mechanism 70 preferably produces a diffraction-limited focused spot. DMM 70 preferably compensates for astigmatism and keeps the spot round when in the defocused configuration. The oval shape of the concave mirror corrects for astigmatism caused by the 45 degree incidence. The un-actuated/actuated mirror preferably maintains its flatness specification under the thermal stress of reflecting a 3 watt or higher wattage beam. The curvature of the deformed mirror should minimize the distortion of irradiance at the beam center. A convex actuator could alternatively be employed.

With reference again to FIGS. 2–5, DMM controller 20 is in communication with actuator 72 and controls the focal effect of flexible sheet 56. DMM controller 20 is also preferably in communication with laser system controller 16 such that focal effect changes to flexible sheet 56 can be coordinated with the firing of laser output 38 and/or the movements directed by positioning system 62. Actuator 72 is preferably driven in the range of about 0 to 100 volts. However, 120 V or higher voltage can be employed if more stroke is desired but may be limited by the amount of stress applied to DMM 70. Actuator 72 preferably has a response time to focus of less than about 2 ms, and more preferably less than about 1 ms, including settling time. The settling criteria is preferably less than about +/−1% focal length. A preferred design actuation frequency is about 300 Hz.

If a temperature sensor is employed to compensate for changes in the actuator stroke due to temperature, the drive electronics of DMM controller 20 can receive a temperature sensor signal from DMM 70 and laser system controller 16 is adapted to support a calibration procedure and provide closed loop control of the mirror temperature compensation. DMM controller 20 preferably interfaces with actuator 72 through a DAC and one or more FETs, and temperature feedback can be applied through an ADC. Actuator 72 preferably exhibits a hysteresis of less than 10%.

A graphical user interface and/or host software common to laser system controllers 16 is preferably modified to add mirror focal length to the properties of the drilling tool/ operations, and diagnostics can be updated to allow an operator direct control of the mirror focal length for testing and alignment.

Figure 8:
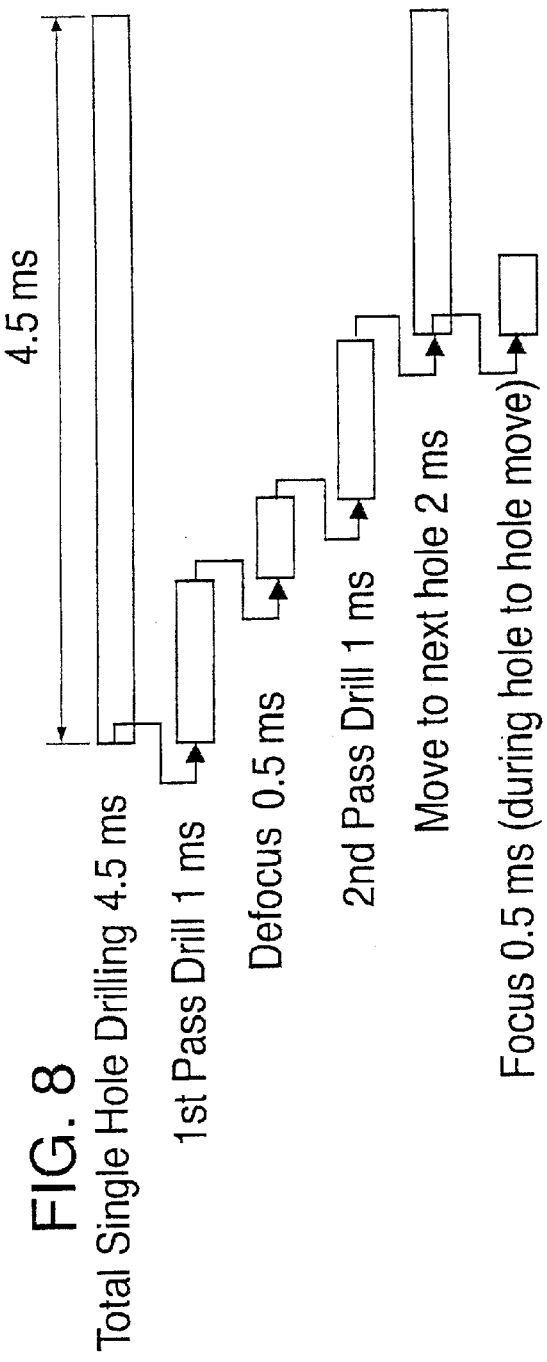
FIG. 8 is an exemplary time line for a single-pass, two-step via drilling process of the present invention.
Figure 27:
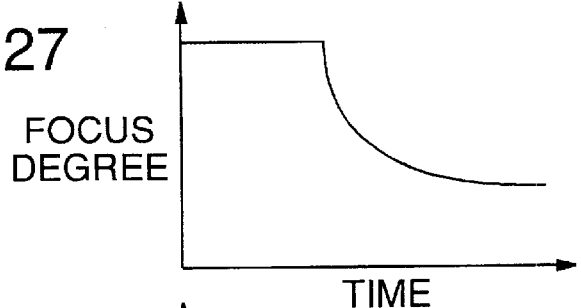
FIG. 27 is an alternative exemplary focus level versus time profile for a laser blind via-drilling process.
Figure 28:
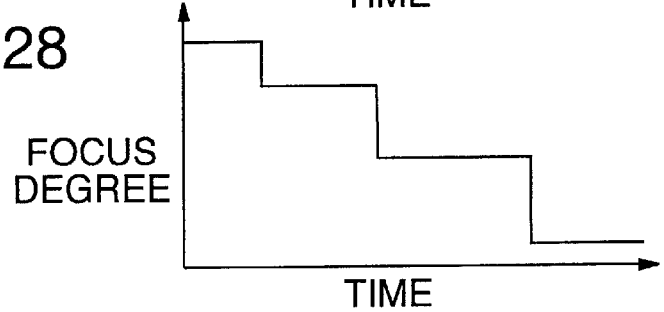
FIG. 28 is an alternative exemplary focus level versus time profile for a laser blind via-drilling process.
Figure 29:
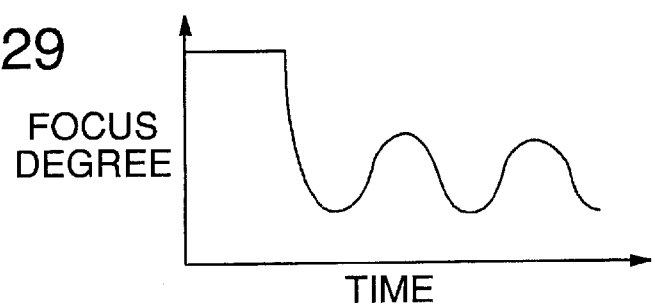
FIG. 29 is an alternative exemplary focus level versus time profile for a laser blind via-drilling process.

FIG. 8 is an exemplary time line for a single-pass, two-step via drilling process of the present invention. The throughput analysis assumes a hole drilling time of 2 ms and a 2 ms move time. Actuator 72 decreases the total time to process a hole to 4.5 ms. The time for re-establishing focus is absorbed in the move time to the next hole. With reference to FIGS. 27–29, it is also possible to keep the laser on during most or all of the profiled defocusing to save an additional 0.5 ms per hole.

Figure 9:
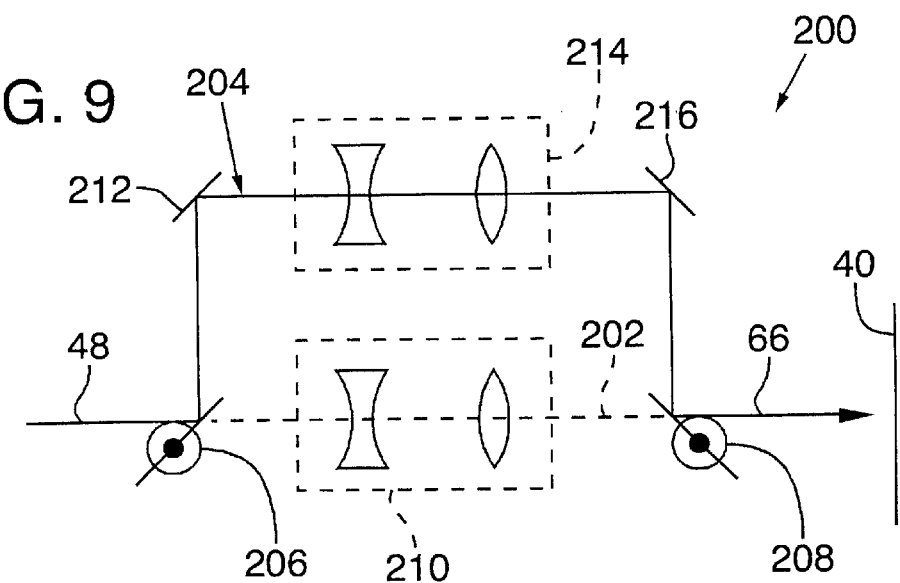
FIG. 9 is a simplified schematic view of an alternative single pass actuator assembly, which employs a galvanometer mirror assembly, that can be substituted for the deformable mirror mechanism in the laser system of FIG. 2.
Figure 10:
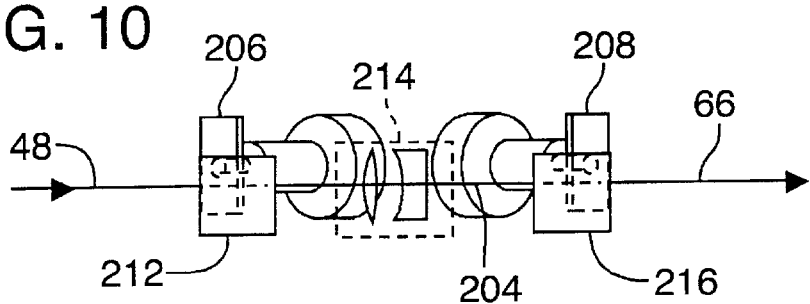
FIG. 10 is a detailed side view of the galvanometer mirror assembly shown in FIG. 9.
Figure 11:
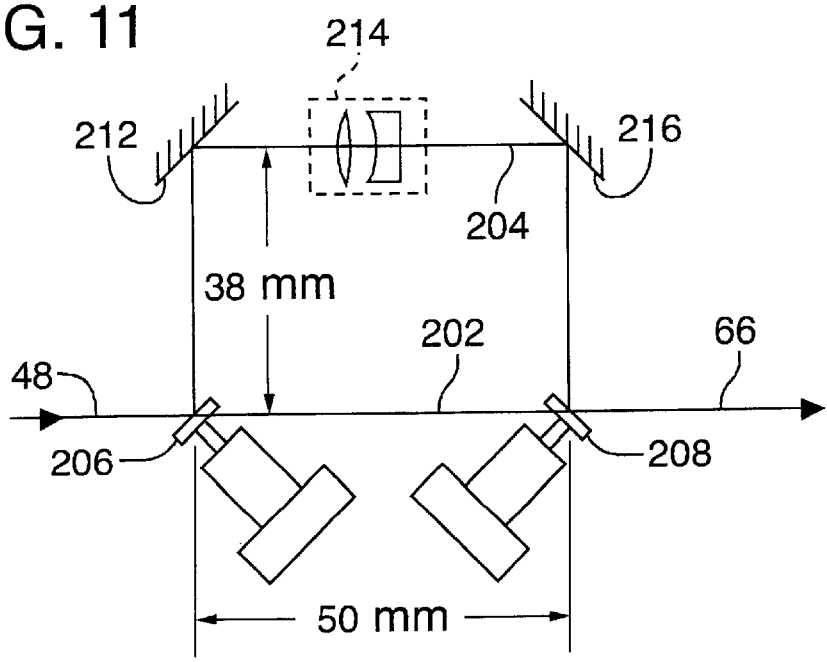
FIG. 11 is a top view of the galvanometer mirror assembly shown in FIG. 10.

FIG. 9 is a simplified schematic view of an alternative single pass actuator assembly 200, which employs alternative galvanometer mirror pathways 202 and 204, that can be substituted for the deformable mirror mechanism 70 in the laser system of FIG. 2. FIG. 10 is a detailed side view of the galvanometer mirror pathways 202 and 204 shown in FIG. 9. FIG. 11 is a top view of the galvanometer mirror pathways 202 and 204 shown in FIG. 10. With reference to FIGS. 2 and 9–11, beam path 48 is directed toward galvanometer mirror 206 that either permits laser output 38 to propagate along pathway 202 through collimating lens components 210 and past galvanometer mirror 208 or reflects laser output 38 off mirror 212, along pathway 204, through collimating lens components 214, off mirror 216, off galvanometer mirror 208, and toward workpiece 40.

One of collimating lens components 210 or 214 creates focus while the other creates defocus. Skilled persons will appreciate that either or both of collimating lens components 210 or 214 can be variable to modify the spatial spot size to suit different applications. Skilled persons will also appreciate that collimating lens components 210 in pathway 202 may be omitted as shown in FIGS. 10 and 11. For example, pathway 202 can implement defocus and pathway 204 can implement focus. Alternatively, for example, pathway 204 can implement defocus and collimating components 210 can be positioned after galvanometer mirror 208 or before galvanometer mirror 206.

FIG. 12 is a cross-sectional side view of an enlarged portion of a generic laser workpiece 40 that may, for example, be an IC chip package, MCM, capacitor, circuit board, resistor, or hybrid or semiconductor microcircuit. For convenience, workpiece 40 is depicted as having only four layers 264, 266, 268, and 270.

Layers 264 and 268 may contain, for example, standard metals such as, aluminum, copper, gold, molybdenum, nickel, palladium, platinum, silver, titanium, tungsten, metal nitrides, or combinations thereof. Conventional metal layers 264 and 268 vary in thickness, typically between 9–36 $\mu$m (where $7.8 \times 10^{-3}$ kg of metal equals a thickness of about 9 $\mu$m), but may be thinner or as thick as 72 $\mu$m. Conductive layers 264 and 268 are typically made of the same material.

Dielectric matrix or layer 266 may, for example, contain a standard organic dielectric material such as benzocyclobutane (BCB), bismaleimide triazine (BT), cardboard, cyanate esters, epoxies, phenolics, polyimides, polytetrafluoroethylene (PTFE), various polymer alloys, or combinations thereof. Conventional organic dielectric layers 266 vary considerably in thickness, but are typically much thicker than metal layers 264 and 268. An exemplary thickness range for organic dielectric layers 266 is about 30–400 $\mu$m.

Layer 266 may also contain a standard reinforcement component 270 depicted as a woven line in FIG. 12 for convenience. Components 270 may be fiber matte or dispersed particles of, for example, aramid fibers, ceramics, or glass woven or dispersed throughout organic dielectric layer 266 and may comprise much of its thickness. Conventional reinforcement components 270 are typically individual filaments or particles of about 1–10 $\mu$m in size and/or woven bundles of 10 $\mu$m to several hundreds of microns. Skilled persons will appreciate that reinforcement components 270 may be introduced as powders into the organic dielectrics and can be noncontiguous and nonuniform. Such composite or reinforced dielectric layers 266 typically require laser processing at a higher fluence than is needed to abate unreinforced layers 266. Skilled persons will also appreciate that layers 264, 266, and 268 may also be internally noncontiguous, nonuniform, and nonlevel. Stacks, having several layers of metal, dielectric, and reinforcement material, may be larger than 2 mm.

Workpiece 40 in FIG. 12 also depicts a through-hole via 272a and a blind via 272b (generically via 272) produced by laser system 10. Through-hole 272a cleanly and evenly penetrates all layers and materials of workpiece 40 and exhibits negligible taper from its top 276 to its bottom 278. Taper angle $\phi$ is preferably less than 45°, more preferably less than 30°, and most preferably 0–10° with respect to normal axis 277.

Blind via 272b does not penetrate all layers and/or materials. In FIG. 12, blind via 272b stops at and does not penetrate layer 268. Thus, proper selection of the laser parameters permits layer 268 to remain unaffected even if it comprises the same metal component(s) as layer 264.

Via diameters preferably range from 25–300 $\mu$m, but laser system 10 may produce vias 272 that have diameters as small as about 5–25 $\mu$m or greater than 1 mm. Because the preferred ablated spot size of output beam 66 is preferably about 25–75 $\mu$m in diameter, vias larger than 25 $\mu$m may be produced by trepanning, concentric circle processing, or spiral processing.

Figure 13:
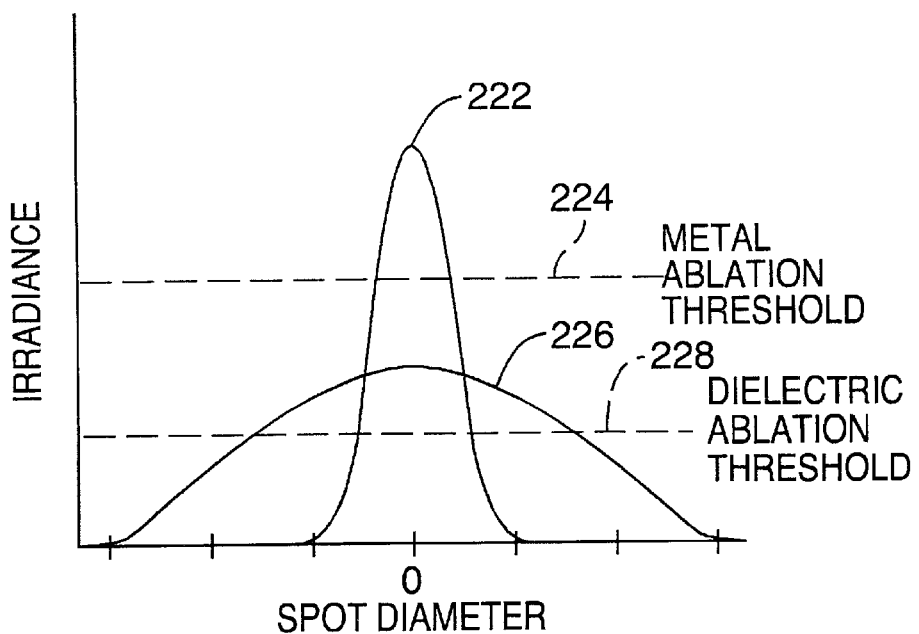
FIG. 13 is an irradiance versus spot diameter graph showing a profile of a first laser output pulse having irradiance sufficient to ablate metal and a second laser output pulse having irradiance sufficient to ablate dielectric but not ablate metal.

FIG. 13 shows a graph demonstrating the inverse relationship between irradiance and spot size for a given laser output power, taking into account the natural Gaussian spatial irradiance profile of laser beam 66. In FIG. 13, an exemplary profile of a pulse of first laser system output 222 has a spot diameter and sufficient energy (above metal ablation threshold 224) to ablate metal layer 264 and an exemplary profile of a pulse of second laser system output 226 has a spot diameter that is substantially larger and sufficient energy (above dielectric ablation threshold 228) to ablate dielectric layer 266 but not to ablate metal layer 264. Thus, in a preferred embodiment, a first laser system output 222 of localized high irradiance or power density is used to ablate metallic layer 264, and a second laser system output 226 of equal power and greater spot size (lower irradiance) is used to ablate an underlying dielectric layer 266. This two step method is especially useful for making blind vias having a metallic bottom layer 268, because the second laser system output 226 has a lower irradiance that is insufficient to ablate metal layer 268, so only dielectric layer 266 is removed. Thus, the two-step machining method provides a depthwise self-limiting blind via because the fluence of second laser system output 226 is insufficient to vaporize metallic bottom layer 268, even if the second laser system output 226 continues after dielectric layer 266 is completely penetrated.

Skilled persons will appreciate that in accordance with single pass method of the present invention, the first and second laser system outputs 222 and 226 are temporally contiguous rather than employing a series of first laser outputs to multiple space-apart targets over an extended surface area of workpiece 40 and then employing a series of second laser outputs to the same multiple spaced-apart targets over the same extended surface area.

FIG. 14 is a diagram showing exemplary differences in spot area and $d_{spot}$ at the surface of workpiece 40 that correspond to different focal effects of actuator 72. With reference to FIG. 14, spot area 240 represents a high degree of focus when flexible sheet 56 is unactivated and flat. Spot area 242 represents an intermediate focal degree imparted by actuator 72 to flexible sheet 56 as an intended partial activation of sheet 56 or during its transition to a low degree of focus. Spot area 244 represents a larger spot area that corresponds to a full activation of sheet 56 and a low degree of focus. Skilled persons will appreciate that an alternative embodiment could employ a flat sheet 56 to impart a low degree of focus and an activated sheet 56 to impart a high degree of focus. In addition, another embodiment contemplates a flexible sheet 56 that is activated when flat and in active when curved or shaped.

In one embodiment, the focused spot has a minimum $1/e^2$ spot size of 8–20 $\mu$m, and preferably 10–16 $\mu$m; and the defocused spot has a maximum $1/e^2$ spot size of 40–150 $\mu$m, preferably 45–130 $\mu$m, and most preferably 60–90 $\mu$m. These $1/e^2$ spot sizes can be smaller or larger than the ablated spot size. In particular, the ablated spot size is typically smaller for very large defocused $1/e^2$ spot sizes when much of the spot area is below the ablation threshold for a particular material.

The parameters of processing output beam 66 are selected to facilitate substantially clean, sequential drilling, i.e., via formation, in a wide variety of metallic, dielectric, and other material targets that may exhibit different optical absorption, ablation threshold, or other characteristics in response to UV or visible light. Preferred parameters of first laser system output 222 include average energy densities greater than about 120 µJ measured over the beam spot area, preferably greater than 200 µJ; spot size diameters or spatial major axes of less than about 50 µm, and preferably from about 1–50 µm; and a repetition rate of greater than about 1 kHz, preferably greater than about 5 kHz, and most preferably even higher than 20 kHz; and a wavelength preferably between about 190–532 nm, and most preferably between about 266 nm and 355 nm. The preferred parameters of processing output beam 66 are selected in an attempt to circumvent certain thermal damage effects by utilizing temporal pulse widths that are shorter than about 100 ns, and preferably from about 40–90 ns or lower. Skilled persons will also appreciate that the spot area of output beam 66 is generally circular, but may be slightly elliptical.

Figure 15:
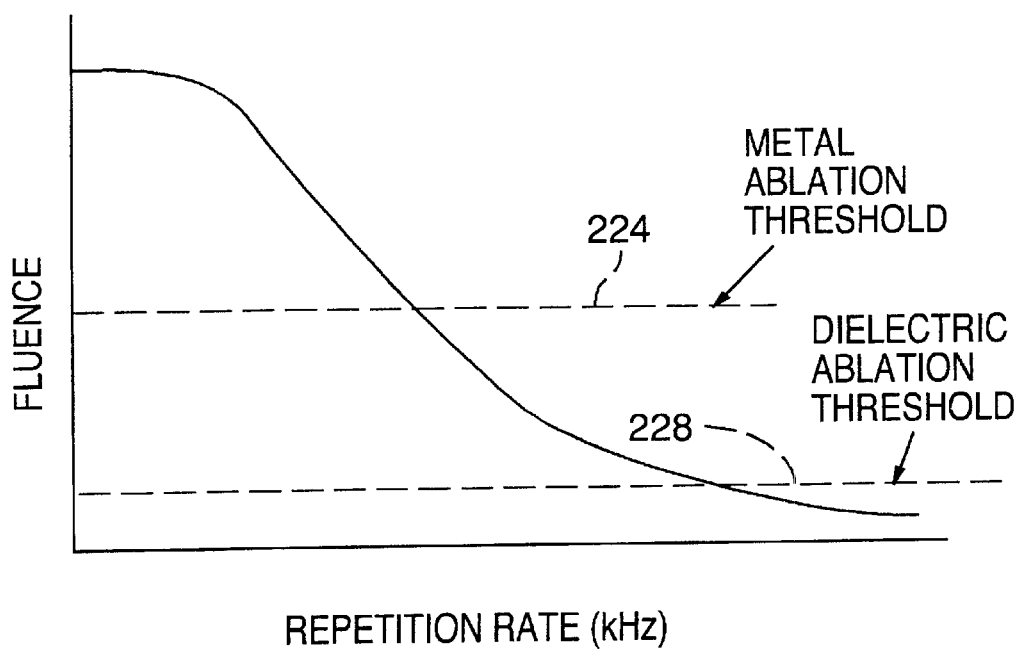
FIG. 15 is fluence versus repetition rate graph showing metal and dielectric ablation thresholds for a fixed spot size.

FIG. 15 shows a graph indicating that the fluence of laser output varies inversely with the pulse repetition rate or frequency (PRF). Thus, for a given spot size, the fluence (energy density) of the first laser system output 222 is greater than metal ablation threshold 224, then the PRF is increased so the fluence of the second laser system output 226 is below metal ablation threshold 224 but above dielectric ablation threshold 228. Skilled persons will appreciate that as lasers 10 achieve greater peak output pulse energies, the fluence versus PRF curve will be displaced higher in the graph.

Figure 16:
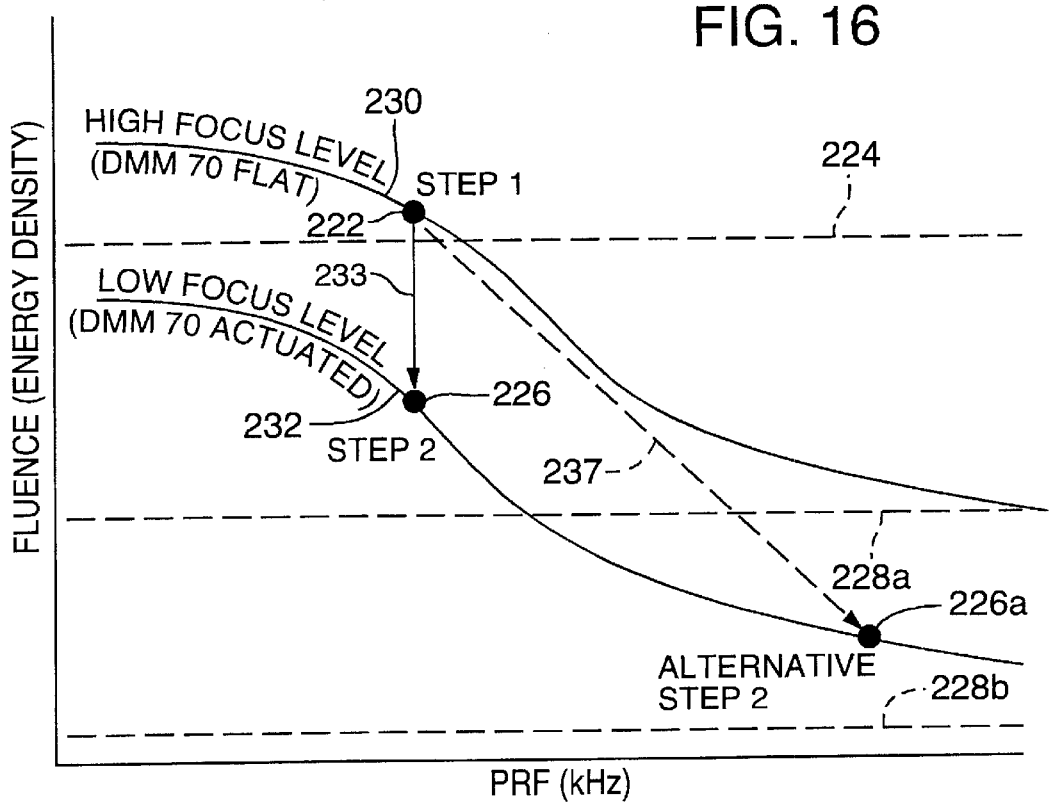
FIG. 16 is a graph showing high and low focus level profiles for fluence versus pulse repetition frequency.

FIG. 16 is a graph showing a high focus level profile 230 and a low focus level profile 232 of fluence versus PRF. With reference to FIG. 16, when flexible sheet 56 is flat, it provides high focus profile 230 for a given laser output power; and when flexible sheet 56 is activated, it provides low focus profile 232 for the same output power. In a preferred embodiment shown by arrow 233, metal layer 264 is processed with first laser system output 222 above metal ablation threshold 224, then flexible sheet 56 is activated so dielectric layer 266 is processed with second step laser system output 226 above dielectric ablation threshold 228 but below the metal ablation threshold 224. In an alternative embodiment shown by arrow 237, the metal layer 264 is processed by first step laser system output 222, then dielectric layer 266 is processed with alternative second step laser system output 226a in which flexible sheet 56 is activated and the PRF is increased such that output 226a is below ablation threshold 228a for reinforced dielectric layers, for example, but above ablation threshold 228b for unreinforced dielectric layers 266, for example. Skilled persons will appreciate that threshold 224 will vary with the thickness of metal layer 264.

FIGS. 17A and 17B are fragmentary cross-sectional views showing the sequential steps carried out to form a depthwise self-limiting blind via in a workpiece 40. FIG. 17A represents the first step of delivering laser beam pulses at a first irradiance that is above ablation threshold 224 of conductor layer 264. The first step removes conductor layer 264 and a portion of dielectric layer 266. FIG. 17B represents the second step of delivering laser pulses at a second irradiance that is below the ablation threshold 224 of conductor layer 266 but above the ablation threshold 228 of dielectric layer 162. This two-step method provides a depthwise self-limiting blind via because the laser beam power density is insufficient to progress depthwise beyond dielectric layer 266 material to vaporize conductor layer 268.

FIG. 18 is a fragmentary cross-sectional view of an incomplete top layer opening 269 for a hole or via (shown in phantom lines) that can be machined in accordance with the invention. The situation depicted in FIG. 18 typically arises in an incompletely chemically pre-etched metal top layer 264 that does not expose dielectric layer 266 in a workpiece 40 that was intended to be machined only through dielectric layer 266. The method steps described with reference to FIGS. 17A and 17B can be carried out to machine a via 272 into this workpiece 40.

FIG. 19 is a fragmentary cross-sectional view of a workpiece 40a that is similar to workpiece 40 but has a second dielectric layer 266a positioned between conductor layer 268 and a third conductor layer 268a. Dielectric layer 266a and conductor layer 268a have ablation thresholds in the same relative proportion to those of dielectric layer 266 and conductor layer 268, respectively. Thus, conductor layers 268 and 268a become the respective middle and bottom conductor layers of workpiece 40a. To form a blind via in workpiece 40a, one repeats the first step by increasing the laser beam pulses to the first irradiance to machine through layer 268 and then repeats the second step by decreasing the laser beam pulses to the second irradiance to machine through dielectric layer 266a and stop at layer 268a. Skilled persons will appreciate that the first step irradiance could be employed to machine through layers 264, 266, and 268 before the focal effect is changed to produce second step irradiance.

FIG. 20 is a fragmentary cross-sectional view of workpiece 40 with a blind via 280 characterized by a depthwise, stepped width of decreasing diameter from top layer 264 to bottom layer 268a. The changes in width are accomplished by selectively decreasing the laser working area after each successive layer or pair of layers, as shown, is penetrated.

Except for scale, FIGS. 12 and 17–20 would have these general appearances if they were formed by two-pass or simple single pass process or formed by trepanning or spiraling as described below. FIGS. 21 and 22 show cutting profiles for forming a through-hole 272c and a blind via 272d, respectively, that are larger than the spot size of output beam 66. With reference to FIG. 21, through-hole 272c defines on the surface of workpiece 40 a circular spatial region 290 having a periphery 292. Output beam 66 has a spot area 294 that is less than the area of region 290. Through-hole 272c is formed by sequentially positioning beam 66 having spot area 294 at overlapping contiguous locations around periphery 292. Beam 66 is preferably moved continuously through each location at a speed sufficient for system 10 to deliver the number of beam pulses necessary to achieve the depth of cut at the location. After beam 66 completes the path around periphery 292, the center target material 296 falls out to form through-hole 272c. This process is called trepanning.

With reference to FIG. 22, blind via 272d also defines on the surface of workpiece 40 a circular region 290 having a periphery 292. Output beam 66 having spot 294 is initially positioned at the center 298 of region 290. Blind via 272d is formed by sequentially positioning beam 66 having spot area 294 at overlapping contiguous locations along a spiral path 299 to periphery 292. Beam 66 is preferably moved continuously through each location at a speed sufficient for system 10 to deliver the number of beam pulses necessary to achieve the depth of cut at the location. As beam 66 proceeds along spiral path 299, the target material is "nibbled" away to form a hole of increasing size each time beam 66 is moved to a new cutting location. The final shape of the hole is achieved when beam 66 moves along a circular path at periphery 292.

An alternative beam cutting path to form blind via 272d would be to start at center 298 and cut concentric circles of incrementally increasing radii defined by spot area 294 of beam 66. The overall diameter of via 272*d* would increase as the concentric circles forming via 272*d* travel in a circular path at greater distances from center 298 of region 290. Alternatively, this process may begin by defining the desired circumference and processing the edges toward the center.

Outward spiral processing tends to be a little more continuous and quicker than concentric circle processing. Skilled persons will appreciate that either workpiece 40 or processing output beam 66 may be fixed or moved relative to the position of the other. In a preferred embodiment, both workpiece 40 and processing output beam 66 are moved simultaneously. Several examples of through-hole vias and blind vias of various depths and diameters produced on a number of different substrates are set forth in U.S. Pat. No. 5,593,606.

FIG. 23 is an alternative conventional trepanning profile 300 that moves a laser spot of consistent diameter along path 302 to form blind via 272*d*. This trepanning profile 300 can be useful for creating mid sized blind vias 272*d* that have diameters that are greater than the largest useful laser spot diameter but small enough to be less efficient for spiraling. Typically, the laser spot starts in center of the via to be formed. Skilled persons will appreciate that blind vias of larger size can be created by trepanning by adjusting the size and number of inner loops. Additionally or alternatively, a partial defocus can be employed for larger vias particularly with thinner metal layers 264 to increase throughput.

Skilled persons will also appreciate that noncircular vias may also be ablated through similar processes. Such vias may, for example, have square, rectangular, oval, slot-like, or other surface geometries. For example, FIG. 24 shows a conventional line-cutting profile 304 including multiple parallel beam paths 306 impinged by a laser spot of consistent diameter to form a line width 308.

Figure 26:
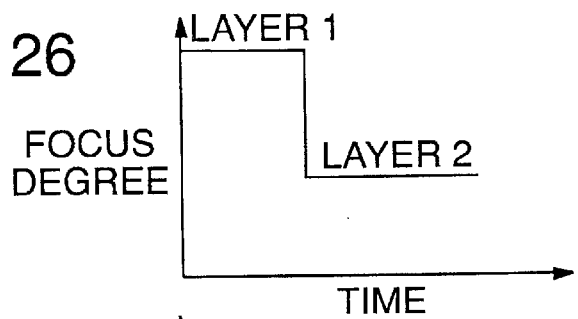
FIG. 26 is an exemplary focus degree versus time profile for a laser, two-step blind via-drilling process.

FIGS. 25 and 26 are respective exemplary fluence versus time and focus degree versus time profiles for a laser, two-step blind via-drilling process. The focus degree is high for a sharply focused beam 66 at the work surface, creating a small laser spot. With respect to these profiles, all the pulses used in the first step to process the first layer are focused at a first focus degree, and all the pulses used in the second step to process the second layer are focused at a second focus degree, regardless of the via size (or trepanning or spiraling).

These profiles resemble, with the exception of move and refocus time, the two step process of Owen et al., which sought to minimize laser damage to the underlying layers. The damage can be characterized in several ways: reflow of bottom metal layer 268, ablation or material removal of the bottom metal layer 268, or delamination of dielectric layer 266 from bottom metal layer 268. With the standard two step process, the second step is performed with beam characteristics such that the fluence level delivered to bottom metal layer 268 is less than the damage threshold 224 of that layer.

However, with respect to the present invention, the change of focus degree is accomplished in an exclusively single pass process employing a quick method of changing energy density at the work surface. The focus profile of FIG. 26 can be achieved with either DMM 70 or single pass actuation assembly 200, and the focus "height" can be either decreased or increased to decrease the degree of focus and hence decrease the energy density on the surface at target location 68.

The single pass process of the present invention permits numerous focus degree versus time profiles such as those shown in FIGS. 27–29 that can be used advantageously for different materials, thicknesses, and laser parameters. The laser spot size changes can be performed while laser 12 is firing and beam positioner 62 is moving. These latter profiles can be achieved with DMM 70 but generally not with single pass actuation assembly 200 unless variable optics are employed. For the profiles of FIGS. 25–29, if the focus height is decreased (lowered) to bring the laser beam out of focus, then energy density, focus degree, and focus height could be used interchangeably to describe the Y-axis with the realization that the relative scales would be different.

With reference to FIGS. 25–27, as the second step begins to remove the remaining dielectric layer 266, it would be more efficient to use a higher fluence than used for the second step in FIG. 25. However, as the second step clears away dielectric layer 266 and exposes the bottom metal layer 268 such that it begins to absorb heat from laser beam 66, bottom metal layer 268 would be better protected by using a lower fluence than used for the second step in FIG. 25. Thus, a gradual defocus of the laser spot during the second step as shown in FIG. 27 would be faster, more efficient, and protect bottom metal layer 268 better than the second step of FIG. 25. The curve can level off just above dielectric ablation threshold 228 or just below the metal damage level. Skilled persons will appreciate that the defocus curve of FIG. 27 can be refined to suit particular types and heights of dielectric layers 266 to increase the speed and efficiency of the via drilling process.

Skilled persons will also appreciate that profiled focusing can be implemented to form blind vias having diameters of the same or larger size as the laser spot size that would require trepanning or spiraling. For the larger sized vias, for example, profiled focusing for machining the second layer as shown in FIGS. 27 or 28 could be coordinated with the positioner movement to control bite size and repeated as desired to efficiently deliver the most energy per time. The bite size is the area or distance of new target material impinged by each sequential laser pulse. A focusing profile that approximates such repetition might appear similar to the focusing profile of FIG. 29.

With reference again to FIGS. 27–29, trepanning path changes can also make more effective use of these and other focus profiles. One net result of using such a focus profile method is that more energy can be delivered per unit time than with a simple two-step process without causing material damage to the inner layer. The beam positioner can dynamically adjust the beam-path pitch to ensure that the energy per unit area delivered to the hole or shape remains more or less constant over the entire hole or shape. This method can facilitate reduction of the heating effects caused by the beam hitting the bottom layer 268.

Figure 30:
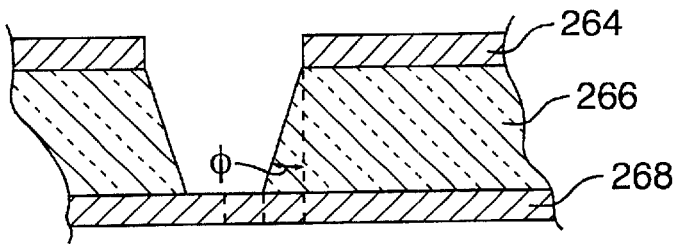
FIGS. 30 and 31 demonstrate how via taper is a function of beam profile.
Figure 31:
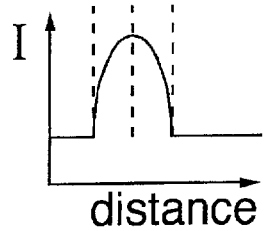

FIGS. 30 and 31 demonstrate how sidewall taper $\phi$ is a function of beam irradiance profile in the radial direction. Sidewall taper $\phi$ results from the Gaussian nature of the $TEM_{00}$ beam profile of standard solid-state lasers. By dynamically changing the pitch of a spiral in conjunction with the profiled focus changes, it is possible to reduce the sidewall taper $\phi$ of the cuts or holes created. A tightly focused beam at the outermost spiral pitch also permits the sidewall to become steeper.

Figure 32:
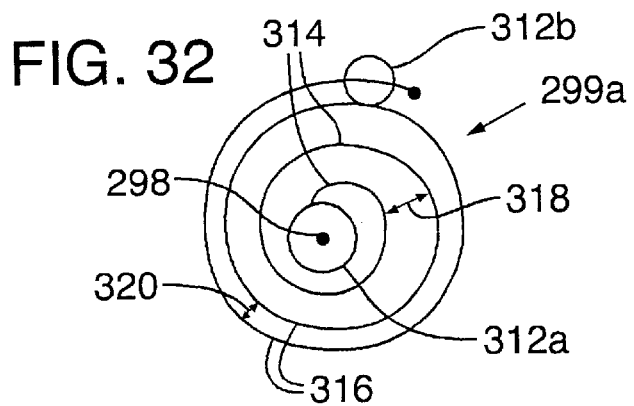
FIG. 32 shows an exemplary trepanning profile for reducing via taper.

FIG. 32 demonstrates a spiraling profile 299*a* for reducing sidewall taper $\phi$. When beam 66 is at the center 298 to begin inner spiral section 314, beam 66 is further out of focus to ablate a larger area at a lower fluence. When the beam positioner 62 reaches outer spiral section 316, beam 66 is focused more tightly to remove or reduce sidewall taper $\phi$.

Spiraling profile 299a can be employed for processing metal or dielectric at the appropriate fluences. Because the bite size can be made larger at the center 298 of spiraling profile 299a, corresponding to a larger spot size of beam 66, this technique has the additional advantage of decreasing the drilling time.

Figure 33:
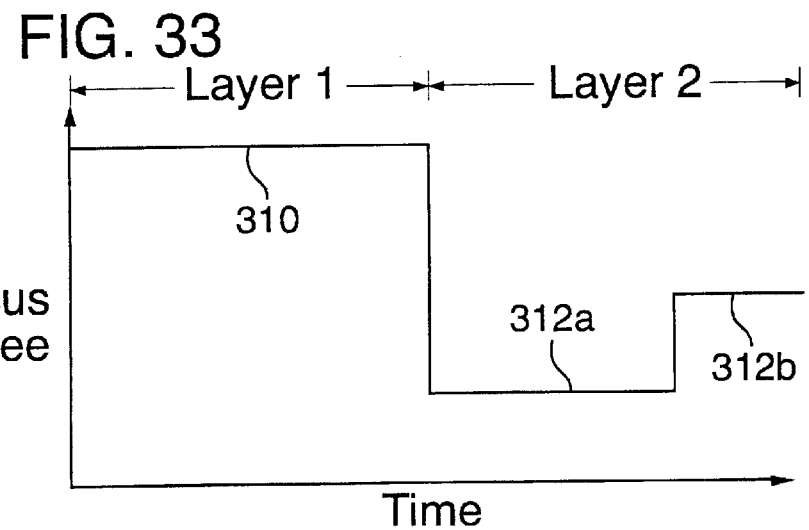
FIG. 33 is an exemplary focus level versus time profile for a blind via trepanning process employing a second step of a single subpass.

With reference to FIG. 33, for example, first layer 264 of material is removed at one focus degree 310 and second layer 266 is removed at two different lower focus degrees 312a and 312b. A large inner pitch 318 ensures that bottom metal layer 268 is not damaged, and a small outer pitch 320 facilitates reduction in taper φ. In an alternative embodiment not shown, the central region of first layer 264 is processed at a focus degree 310 above metal ablation threshold 224 and then the focus degree is increased to provide a greater fluence around the peripheral region. Then, the focused degree is dropped so that the fluence is between thresholds 224 and 228 for processing dielectric layer 266 in the peripheral region and further dropped for processing dielectric layer 266 in the central region.

Skilled persons will appreciate that FIG. 33 depicts a profile where second layer 266 is removed in a single subpass. Skilled persons will also appreciate that if the spiral is started on the outside of the intended hole, a tighter focus would be employed first for the periphery, and then inner spiral section 314 would be machined at greater defocus. This focus profile might resemble that shown in FIG. 28.

Figure 34:
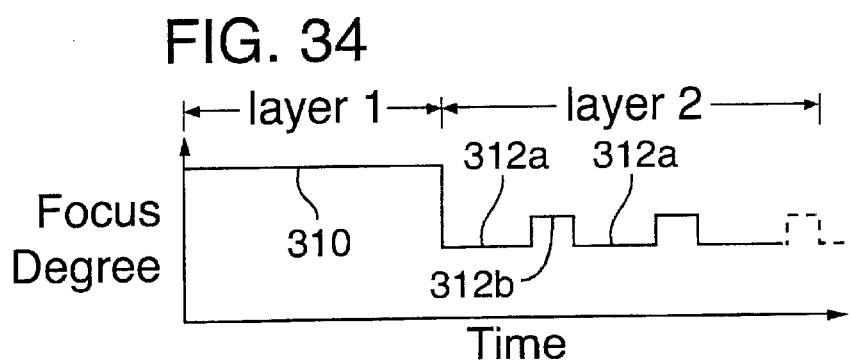
FIG. 34 is an ideal focus level versus time profile for a blind via trepanning process employing a second step of at least two subpasses.

FIG. 34 is an alternative focus degree versus time profile for a via spiraling process where second layer 266 is removed in two or more subpasses. The steepness of the "curve" is limited by the speed of actuator 72 and a more representative profile may resemble a sinusoidal focus level profile such as shown in FIG. 29. Skilled persons will also appreciate that the spiraling profile of FIG. 32 can be employed in the first step against the top layer 264 with both the outer tightly focused beam 66 and the less focused inner beam 66 having greater power density than metal ablation threshold 224.

Figure 35A:
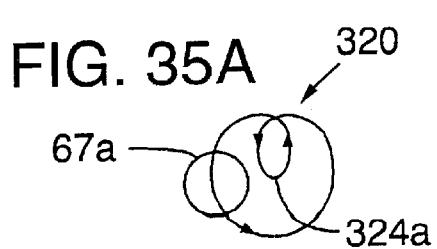
FIG. 35A and 35B are respective steps in an alternative exemplary trepanning profile.
Figure 35B:
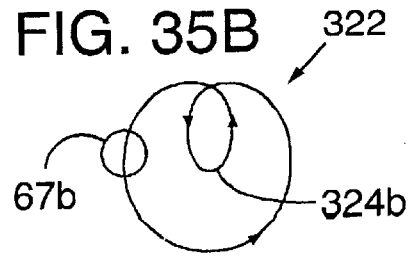

FIG. 35A and 35B are respective steps in an alternative exemplary trepanning profile designed to reduce via sidewall taper 4 for machining layers 264 or 266. Trepan 322 immediately precedes trepan 324 within a given hole and a given layer. Laser spot 67a is larger than and has a lower fluence than spot 67b, and trepan 320 has a smaller circumferential path than does trepan 322. In addition, the laser is turn off during inner loop 324b of trepan 322.

Figure 36:
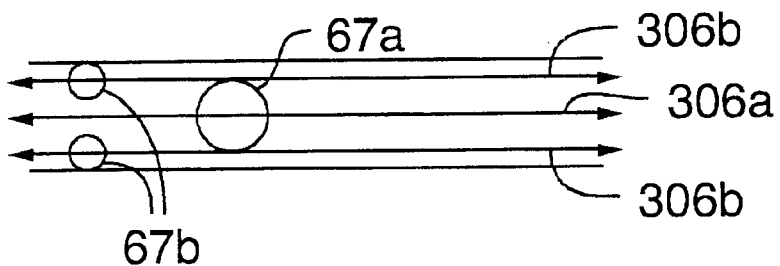
FIG. 36 is an exemplary line-cutting profile that can be implemented with the present invention.

Similarly, with reference to the line-cutting profiles depicted in FIGS. 24 and 36, analogous trepanning-like profiles can be used for arbitrary-shape cutting or drilling to minimize taper φ or lip as desired. Hence, in FIG. 36, a larger laser spot 67a is used to machine interior path(s) 306a, and a smaller laser spot 67b is used to machine exterior paths 306b.

Figure 37:
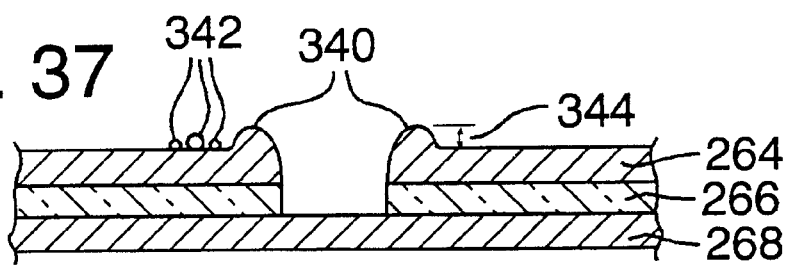
FIG. 37 is an enlarged sectional side elevation view of a multilayered workpiece showing a lip formed around the surface perimeter of a via.
Figure 38:
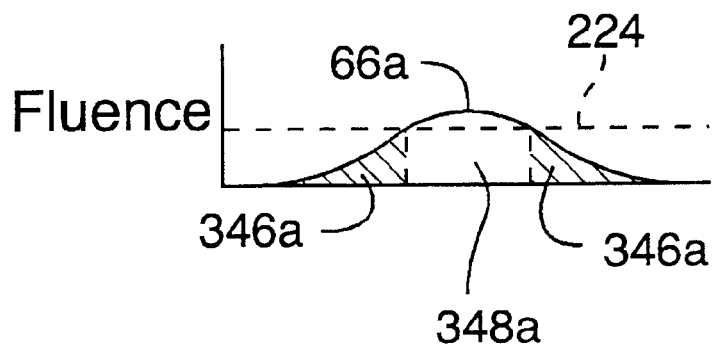
FIG. 38 is a depiction of how low beam energy affects lip formation.
Figure 39:
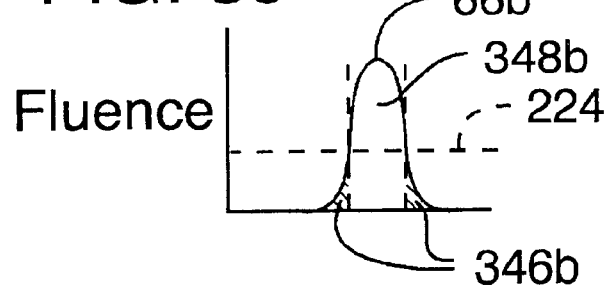
FIG. 39 is a depiction of how high beam energy affects lip formation.

FIG. 37 is an enlarged sectional side elevation view of a multilayered workpiece showing a lip 340 and redeposited debris 342 formed around the surface perimeter of a via. Lip size 344 is related to both the beam profile ($TEM_{00}$) and the low fluence of the second step that can, under some processing conditions, slowly melt top layer 264 around the perimeter of the via. A low energy beam 66a increases areas of low fluence 346a, shown in FIG. 38, and increases the amount of lip formation. To minimize lip 340, it would be desirable to minimize the exposure of top layer 264 to fluences lower than that required to vaporize it. Thus, a high energy beam 66b minimizes areas of low fluence 346b as shown in FIG. 39 and decreases the amount of melted metal that causes lip formation. FIGS. 38 and 39 also show the relative high fluence areas 348a and 348b respectively. Fortunately, focus profiling can also be employed to minimize the types of lips shown in FIG. 37 such as by employing the spiraling and focus level profiles shown in FIGS. 32 and 34. To accomplish the change of focus for the outer spiral with a conventional system would generally require an additional pass or a slow Z height adjustment. By changing the beam diameter at the outer most spiral pitch with a DMM 70 of the present invention, the process developer can tailor lip size 340 to meet specific application requirements without sacrificing throughput.

Skilled persons will appreciate that an unconverted IR beam from a solid-state laser can perform the focus profiling techniques described herein. Skilled persons will also appreciate that output beam 66 can be imaged or clipped of its wings or tails, particularly for first step processing, if desired for specific operations.

Figure 40:
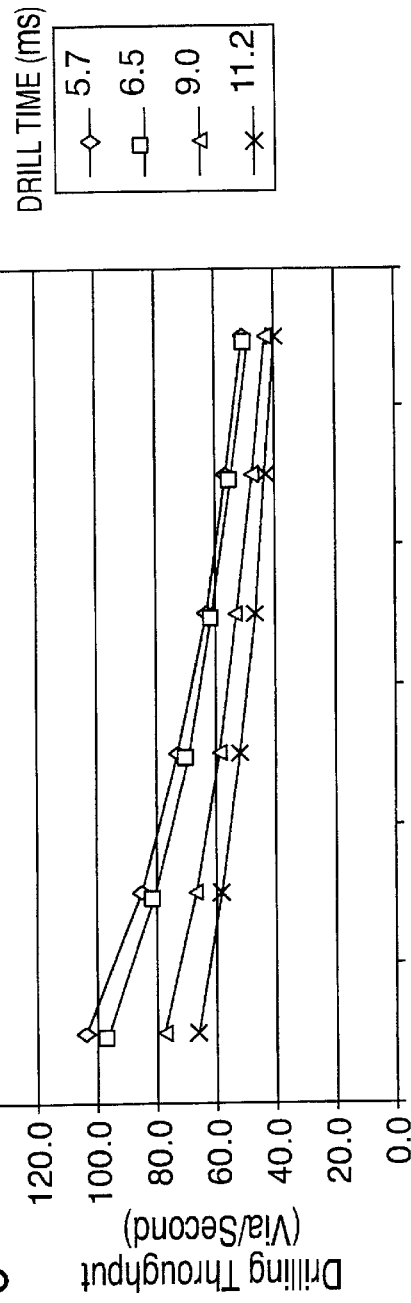
FIGS. 40–42 show comparisons between single pass and double pass via drilling operations having a variety of via drilling times and hole-to-hole move times.
Figure 41:
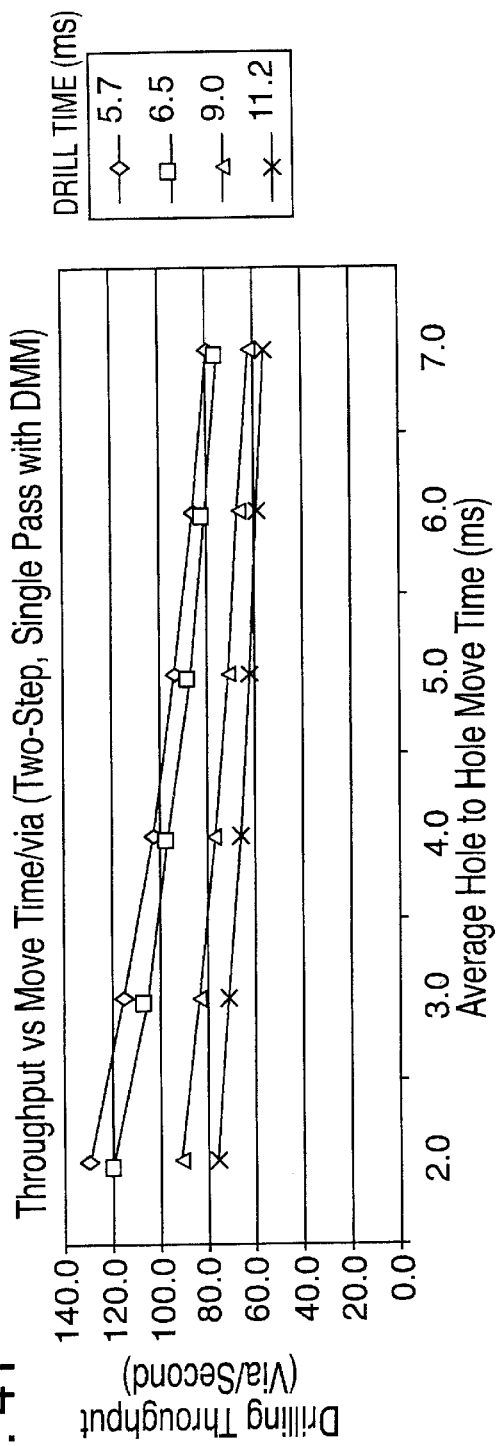
Figure 42:
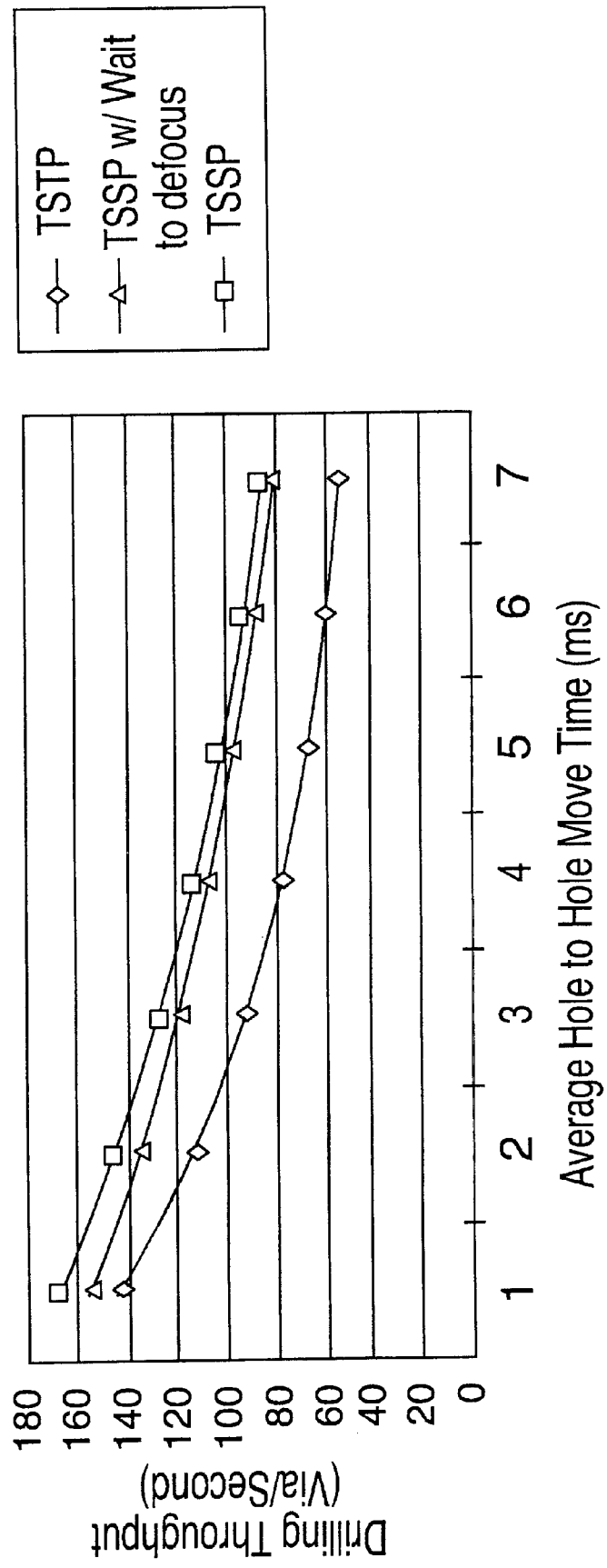

FIGS. 40–42 show throughput versus move time comparisons between single pass and double pass via drilling operations having a variety of via drilling times and hole-to-hole move times. In particular, FIG. 40 shows exemplary conventional two-step, two-pass (TSTP) throughput versus move time for 5.7–11.2 ms drill processing times and 2–7 ms hole-to-hole move times. FIG. 41 shows exemplary two-step, single-pass (TSSP) throughput versus move time for 5.7–11.2 ms drill processing times and 2–7 ms hole-to-hole move times. FIG. 42 shows throughput versus move time comparisons for 5 ms drill processing times and 2–7 ms hole-to-hole move times of TSTP, TSSP, and TSSP where the defocus time is buried in the hole-to-hole move time. The throughput advantages facilitated by the present invention are dramatic.

It will be obvious to those having skill in the art that many changes may be made to the details of the above-described embodiments of this invention without departing from the underlying principles thereof. The scope of the present invention should, therefore, be determined only by the following claims.

What is claimed is:

1. A method for depthwise laser machining through multiple layers at multiple target locations on a multilayered workpiece including at least first and second layers of respective first layer and second layer materials having respective first and second ablation fluence thresholds, comprising:

addressing a beam positioner toward a first target location on the workpiece;

generating a first laser output having a wavelength shorter than 550 nm;

propagating the first laser output along an optical path including a single pass actuation assembly that is selectively changeable to provide at least two different focal effects including a first focal effect to provide a first spot area and a second focal effect to provide a second spot area;

applying the first laser output to the first target location to remove first layer material from the first target location, the first laser output containing at least a first laser pulse that acquires the first focal effect and has a first fluence over the first spot area, and the first fluence being greater than the first ablation fluence threshold;

causing the single pass actuation assembly to provide the second focal effect that is different from the first focal effect;

generating a second laser output having a wavelength shorter than 550 nm;

propagating the second laser output along the optical path including the single pass actuation assembly;

applying the second laser output to the first target location to remove second layer material from the first target location, the second laser output containing at least a second laser pulse that acquires the second focal effect and has a second fluence over a second spot area, and the second fluence being greater than the second ablation fluence threshold;

addressing the beam positioner toward a second target location, different from the first target location, on the workpiece;

causing the single pass actuation assembly to provide a third focal effect;

generating a third laser output having a wavelength shorter than 550 nm;

propagating the third laser output along an optical path including the single pass actuation assembly;

applying the third laser output to the second target location to remove first layer material from the second target location, the third laser output containing at least a third laser pulse that acquires the third focal effect and has a third fluence over a third spot area, and the third fluence being greater than the first ablation fluence threshold;

causing the single pass actuation assembly to provide a fourth focal effect that is different from the third focal effect;

generating a fourth laser output having a wavelength shorter than 550 nm;

propagating the fourth laser output along the optical path including the single pass actuation assembly;

applying the fourth laser output to the second target location to remove second layer material from the second target location, the fourth laser output containing at least a fourth laser pulse that acquires the fourth focal effect and has a fourth fluence over a fourth spot area, and the fourth fluence being greater than the second ablation fluence threshold.

2. The method of claim 1 further comprising:
causing the single pass actuation assembly to switch between providing the first focal effect and the second focal effect in less than 2 ms.

3. The method of claim 2 further comprising:
causing the single pass actuation assembly to switch between providing the first focal effect and the second focal effect in less than 1 ms.

4. The method of claim 1 in which the first and second target locations are separated by a distance that incurs a positioning move time, further comprising:
causing the single pass actuation assembly to switch between providing the first focal effect and the second focal effect in a focal time that is shorter than the positioning move time.

5. The method of claim 1 wherein the single pass actuation assembly comprises a deformable mirror having a mirror surface of a first shape for providing the first focal effect, further comprising:
changing the mirror surface to have a second shape to provide the second the second focal effect.

6. The method of claim 5 further comprising:
applying a voltage to an actuator supporting the mirror surface to switch between the focal effects.

7. The method of claim 6 wherein the actuator comprises an electrostrictive PMN device.

8. The method of claim 5 wherein the deformable mirror has a response time of less than 0.5 ms.

9. The method of claim 5 in which the mirror is actuated at a frequency of greater than 100 Hz.

10. The method of claim 9 in which the mirror is actuated at a frequency of greater than 300 Hz.

11. The method of claim 1 wherein the single pass actuation assembly comprises distinct first and second focal paths that create the respective first and second focal effects.

12. The method of claim 11 in which a pair of galvanometer mirrors effect switching between the first and second focal paths.

13. The method of claim 1 in which the first fluence is greater than the second fluence.

14. The method of claim 1 wherein the first layer comprises a first conductor material and the second layer comprises a dielectric material; wherein the conductor material is positioned above the dielectric material; wherein a third layer of a second conductor material is positioned below the dielectric material and has a second conductor ablation fluence threshold; and wherein the second fluence is less than the second conductor ablation fluence threshold such that the second conductor material is substantially undamaged and a depthwise self-limiting blind via is formed.

15. The method of claim 14 wherein the first and second conductor materials are substantially the same.

16. The method of claim 1 in which the laser pulses of the first and second laser outputs have pulse energies that are substantially the same.

17. The method of claim 1 in which the first and second laser outputs are generated by a solid-state laser comprising Nd:YAG, Nd:YLF, Nd:YAP, or Nd:YVO$_4$.

18. The method of claim 1 in which the first spot area is smaller than the second spot area.

19. The method of claim 1 in which the first spot area has a $1/e^2$ diameter that is less than about 25 µm.

20. The method of claim 19 in which the first spot area has a $1/e^2$ diameter that is less than about 15 µm.

21. The method of claim 1 in which the first and second laser outputs comprise substantially the same wavelength.

22. The method of claim 1 in which the wavelengths of the first and second outputs comprise about 355 nm or 266 nm.

23. The method of claim 1 in which the first and third fluences comprise a fluence of greater than or equal to 10 J/cm$^2$ in at least some region of the first and third spot areas.

24. The method of claim 1 in which the second and fourth fluences comprise a fluence of greater than or equal to 0.5 J/cm$^2$ in at least some region of the second and fourth spot areas.

25. The method of claim 1 in which the single pass actuation assembly is selectively changeable to provide multiple focal effects for respective multiple laser pulses with respective multiple spot areas of sizes between those of the first and second spot areas, the respective multiple spot areas thereby receiving respectively different fluences from the multiple laser pulses.

26. The method of claim 25 wherein the first layer comprises a first conductor material and the second layer comprises a dielectric material; wherein the conductor material is positioned above the dielectric material; wherein a third layer of a second conductor material is positioned below the dielectric material and has a second conductor ablation fluence threshold; wherein the second fluence is less than the second conductor ablation fluence threshold; and wherein the respectively different fluences generally diminish as the multiple laser pulses approach the third layer such that the second conductor material is substantially undamaged and a depthwise self-limiting blind via is formed.

27. The method of claim 26 wherein the blind via has a bottom at the third layer and diminished fluence pulses are employed to clean out dielectric material from the bottom of the blind via.

28. The method of claim 1 in which the spot areas define respective spot sizes that are smaller than and fit within first and second spatial regions of the respective first and second target locations, the first and second spatial regions being divisible into multiple positions defining a contiguous set of spot areas that cover the spatial regions, the method further comprising:
    directing the first laser outputs to first multiple positions associated with the first spatial region to remove multiple amounts of target material corresponding to multiple respective first spot areas;
    directing the second laser outputs to second multiple positions associated with the first spatial region to remove multiple amounts of target material corresponding to multiple respective second spot areas;
    directing the third laser outputs to multiple positions associated with the second spatial region to remove multiple amounts of target material corresponding to multiple respective third spot areas; and
    directing the fourth laser outputs to multiple positions associated with the second spatial region to remove multiple amounts of target material corresponding to multiple respective fourth spot areas.

29. The method of claim 28, further comprising:
    after applying the second laser output and prior to addressing the beam positioner toward the second target location, causing the single pass actuation assembly to provide a fifth focal effect;
    generating a fifth laser output having a wavelength shorter than 550 nm;
    propagating the fifth laser output along the optical path including the single pass actuation assembly;
    applying the fifth laser output to the first target location to remove second layer material from the first target location, the fifth laser output containing at least a fifth laser pulse that acquires the fifth focal effect and has a fifth fluence over a fifth spot area, and the fifth fluence being greater than the second ablation fluence threshold but different from the second fluence;
    after applying the fourth laser output, causing the single pass actuation assembly to provide a sixth focal effect;
    generating a sixth laser output having a wavelength shorter than 550 nm;
    propagating the sixth laser output along the optical path including the single pass actuation assembly; and
    applying the sixth laser output to the second target location to remove second layer material from the second target location, the sixth laser output containing at least a sixth laser pulse that acquires the sixth focal effect and has a sixth fluence over a sixth spot area, and the sixth fluence being greater than the second ablation fluence threshold but different from the fourth fluence.

30. The method of claim 29 in which the spatial regions having a periphery and a central portion; in which the fifth and sixth fluences are respectively greater than the second and fourth fluences; and in which second and fourth spot areas are applied to the central portion and the fifth and sixth spot areas are applied to the periphery.

31. The method of claim 1, further comprising:
    after applying the second laser output and prior to addressing the beam positioner toward the second target location, causing the single pass actuation assembly to provide a fifth focal effect;
    generating a fifth laser output having a wavelength shorter than 550 nm;
    propagating the fifth laser output along the optical path including the single pass actuation assembly;
    applying the fifth laser output to the first target location to remove second layer material from the first target location, the fifth laser output containing at least a fifth laser pulse that acquires the fifth focal effect and has a fifth fluence over a fifth spot area, and the fifth fluence being greater than the second ablation fluence threshold but different from the second fluence;
    after applying the fourth laser output, causing the single pass actuation assembly to provide a sixth focal effect;
    generating a sixth laser output having a wavelength shorter than 550 nm;
    propagating the sixth laser output along the optical path including the single pass actuation assembly; and
    applying the sixth laser output to the second target location to remove second layer material from the second target location, the sixth laser output containing at least a sixth laser pulse that acquires the sixth focal effect and has a sixth fluence over a sixth spot area, and the sixth fluence being greater than the second ablation fluence threshold but different from the fourth fluence.

32. The method of claim 31 in which the fifth and sixth fluences are respectively smaller than the second and fourth fluences.

33. The method of claim 31 in which the fifth and sixth fluences are respectively greater than the second and fourth fluences.

34. The method of claim 1 in which the first and third fluences are substantially the same and in which the second and fourth fluences are the same.

35. The method of claim 1 in which the first and third focal effects are substantially the same.

36. The method of claim 1 in which the first and third laser outputs have different pulse repetition rates so the first and third fluences are different, and in which the second and fourth laser outputs have different pulse repetition rates so the second and fourth fluences are different.

37. The method of claim 1 in which the first and third spot areas are different so the first and third fluences are different.

38. The method of claim 1 in which the first and second laser outputs have different pulse repetition rates, and in which the third and fourth laser outputs have different pulse repetition rates.

39. The method of claim 18 in which the second spot area has a $1/e^2$ diameter that is greater than about 40 $\mu$m.

40. The method of claim 19 in which the second spot area has a $1/e^2$ diameter that is greater than about 60 $\mu$m.

41. The method of claim 5 in which the spot areas define respective spot sizes that are smaller than and fit within first and second spatial regions of the respective first and second target locations, the first and second spatial regions being divisible into multiple positions defining a contiguous set of spot areas that cover the spatial regions, the method further comprising:
    directing the first laser outputs to first multiple positions associated with the first spatial region to remove multiple amounts of target material corresponding to multiple respective first spot areas;

directing the second laser outputs to second multiple positions associated with the first spatial region to remove multiple amounts of target material corresponding to multiple respective second spot areas;

directing the third laser outputs to multiple positions associated with the second spatial region to remove multiple amounts of target material corresponding to multiple respective third spot areas; and directing the fourth laser outputs to multiple positions associated with the second spatial region to remove multiple amounts of target material corresponding to multiple respective fourth spot areas.

42. The method of claim 41, further comprising:

after applying the second laser output and prior to addressing the beam positioner toward the second target location, causing the single pass actuation assembly to provide a fifth focal effect;

generating a fifth laser output having a wavelength shorter than 550 nm;

propagating the fifth laser output along the optical path including the single pass actuation assembly;

applying the fifth laser output to the first target location to remove second layer material from the first target location, the fifth laser output containing at least a fifth laser pulse that acquires the fifth focal effect and has a fifth fluence over a fifth spot area, and the fifth fluence being greater than the second ablation fluence threshold but different from the second fluence;

after applying the fourth laser output, causing the single pass actuation assembly to provide a sixth focal effect;

generating a sixth laser output having a wavelength shorter than 550 nm;

propagating the sixth laser output along the optical path including the single pass actuation assembly; and applying the sixth laser output to the second target location to remove second layer material from the second target location, the sixth laser output containing at least a sixth laser pulse that acquires the sixth focal effect and has a sixth fluence over a sixth spot area, and the sixth fluence being greater than the second ablation fluence threshold but different from the fourth fluence.

43. The method of claim 42 in which the spatial regions having a periphery and a central portion; in which the fifth and sixth fluences are respectively greater than the second and fourth fluences; and in which second and fourth spot areas are applied to the central portion and the fifth and sixth spot areas are applied to the periphery.

44. The method of claim 5, further comprising:

after applying the second laser output and prior to addressing the beam positioner toward the second target location, causing the single pass actuation assembly to provide a fifth focal effect;

generating a fifth laser output having a wavelength shorter than 550 nm;

propagating the fifth laser output along the optical path including the single pass actuation assembly;

applying the fifth laser output to the first target location to remove second layer material from the first target location, the fifth laser output containing at least a fifth laser pulse that acquires the fifth focal effect and has a fifth fluence over a fifth spot area, and the fifth fluence being greater than the second ablation fluence threshold but different from the second fluence;

after applying the fourth laser output, causing the single pass actuation assembly to provide a sixth focal effect;

generating a sixth laser output having a wavelength shorter than 550 nm;

propagating the sixth laser output along the optical path including the single pass actuation assembly; and applying the sixth laser output to the second target location to remove second layer material from the second target location, the sixth laser output containing at least a sixth laser pulse that acquires the sixth focal effect and has a sixth fluence over a sixth spot area, and the sixth fluence being greater than the second ablation fluence threshold but different from the fourth fluence.

45. The method of claim 44 in which the fifth and sixth fluences are respectively smaller than the second and fourth fluences.

46. The method of claim 44 in which the fifth and sixth fluences are respectively greater than the second and fourth fluences.

47. A method for depthwise laser machining through layers of a multilayered workpiece including at least first and second layers of respective first layer and second layer materials having respective first and second ablation fluence thresholds, comprising:

generating a first laser output having a wavelength shorter than 356 nm;

propagating the first laser output along an optical path including a deformable mirror having a mirror surface of a first shape to provide a first focal effect;

applying the first laser output to a target location on the workpiece to remove first layer material within the target location, the first laser output containing at least a first laser pulse having a first fluence over a first spot area, and the first fluence being greater than the first ablation fluence threshold;

changing the mirror surface to have a second shape in less than two milliseconds to provide a second focal effect that is different from the first focal effect;

generating a second laser output having a wavelength shorter than 356 nm;

propagating the second laser output along the optical path including the deformable mirror having the mirror surface of the second shape;

applying the second laser output to the target location on the workpiece to remove second layer material within the target location, the second laser output containing at least a second laser pulse having a second fluence over a second spot area that is greater than the first spot area, and the second fluence being greater than the second ablation fluence threshold and less than the first ablation fluence threshold.

48. The method of claim 47 further comprising:

causing the deformable mirror to switch between providing the first focal effect and the second focal effect in less than 1 ms.

49. The method of claim 47 further comprising:

applying a voltage to an actuator supporting the mirror surface to switch between the focal effects.

50. The method of claim 49 wherein the actuator comprises an electrostrictive PMN device.

51. The method of claim 47 wherein the deformable mirror has a response time of less than 0.5 ms.

52. The method of claim 47 in which the mirror is actuated at a frequency of greater than 100 Hz.

53. The method of claim 52 in which the mirror is actuated at a frequency of greater than 300 Hz.

54. The method of claim 47 wherein the first layer comprises a first conductor material and the second layer comprises a dielectric material; wherein the conductor material is positioned above the dielectric material; wherein a third layer of a second conductor material is positioned below the dielectric material and has a second conductor ablation fluence threshold; and wherein the second fluence is less than the second conductor ablation fluence threshold such that the second conductor material is substantially undamaged and a depthwise self-limiting blind via is formed.

55. The method of claim 47 in which the laser pulses of the first and second laser outputs have pulse energies that are substantially the same.

56. The method of claim 47 in which the first and second laser outputs are generated by a solid-state laser comprising Nd:YAG, Nd:YLF, Nd:YAP, or Nd:YVO$_4$.

57. The method of claim 47 in which the first spot area has a $1/e^2$ diameter that is less than about 25 µm.

58. The method of claim 57 in which the first spot area has a $1/e^2$ diameter that is less than about 15 µm.

59. The method of claim 47 in which the first and second laser outputs comprise substantially the same wavelength.

60. The method of claim 47 in which the wavelengths of the first and second outputs comprise about 355 nm or 266 nm.

61. The method of claim 47 in which the first fluence comprises a fluence of greater than or equal to 10 J/cm$^2$ in at least some region of the first spot area.

62. The method of claim 47 in which the second fluence comprises a fluence of greater than or equal to 0.5 J/cm$^2$ in at least some region of the second spot area.

63. The method of claim 47 in which the deformable mirror is selectively changeable to provide multiple focal effects for respective multiple laser pulses with respective multiple spot areas of sizes between those of the first and second spot areas, the respective multiple spot areas thereby receiving respectively different fluences from the multiple laser pulses.

64. The method of claim 63 wherein the first layer comprises a first conductor material and the second layer comprises a dielectric material; wherein the conductor material is positioned above the dielectric material; wherein a third layer of a second conductor material is positioned below the dielectric material and has a second conductor ablation fluence threshold; wherein the second fluence is less than the second conductor ablation fluence threshold; and wherein the respectively different fluences generally diminish as the multiple laser pulses approach the third layer such that the second conductor material is substantially undamaged and a depthwise self-limiting blind via is formed.

65. The method of claim 64 wherein the blind via has a bottom at the third layer and diminished fluence pulses are employed to clean out dielectric material from the bottom of the blind via.

66. The method of claim 47 in which the spot areas define respective spot sizes that are smaller than and fit within a spatial region of the target location, the spatial region being divisible into multiple positions defining a contiguous set of spot areas that cover the spatial region, the method further comprising:

directing respective multiple pulses of the first laser output to respective multiple first positions associated with the spatial region to remove multiple amounts of target material corresponding to multiple respective first spot areas; and directing respective multiple pulses of the second laser output to respective multiple second positions associated with the spatial region to remove multiple amounts of target material corresponding to multiple respective second spot areas.

67. The method of claim 66, further comprising:

after applying the second laser output and prior to addressing the beam positioner toward a second target location, causing the deformable mirror to provide a third focal effect;

generating a third laser output having a wavelength shorter than 550 nm;

propagating the third laser output along the optical path including the deformable mirror; and applying the third laser output to the target location to remove second layer material from the target location, the third laser output containing at least a third laser pulse that acquires the third focal effect and has a fifth fluence over a third spot area, and the third fluence being greater than the second ablation fluence threshold but different from the second fluence.

68. The method of claim 67 in which the spatial region has a periphery and a central portion; in which the third fluence is greater than the second; and in which second spot area is applied to the central portion and the third spot area is applied to the periphery.

69. The method of claim 47, further comprising:

after applying the second laser output and prior to addressing the beam positioner toward a second target location, causing the deformable mirror to provide a third focal effect;

generating a third laser output having a wavelength shorter than 550 nm;

propagating the third laser output along the optical path including the deformable mirror;

applying the third laser output to the target location to remove second layer material from the target location, the third laser output containing at least a third laser pulse that acquires the third focal effect and has a third fluence over a third spot area, and the third fluence being greater than the second ablation fluence threshold but different from the second fluence;

after applying the third laser output, causing the single pass actuation assembly to provide a fourth focal effect;

generating a fourth laser output having a wavelength shorter than 550 nm;

propagating the fourth laser output along the optical path including the deformable mirror; and applying the fourth laser output to the second target location to remove second layer material from the second target location, the fourth laser output containing at least a fourth laser pulse that acquires the fourth focal effect and has a fourth fluence over a fourth spot area, and the fourth fluence being greater than the second ablation fluence threshold but different from the second and third fluences.

70. The method of claim 69 in which the third and fourth fluences are smaller than the second fluence.

71. The method of claim 69 in which the third or fourth fluence is greater than the second fluence.

72. The method of claim 47 in which the first and second laser outputs have different pulse repetition rates.

73. The method of claim 47 in which the second spot area has a $1/e^2$ diameter is that greater than about 40 µm.

74. The method of claim 59 in which the second spot area has a $1/e^2$ diameter that is greater than about 60 µm.

75. A method for laser processing a layer of material within a spatial region on a workpiece, the material having an ablation fluence threshold and the spatial region having a peripheral region and a central region, comprising:

addressing a beam positioner toward a first region selected from the central region or the peripheral region of the spatial region on the workpiece;

generating a first laser output;

propagating the first laser output along an optical path including a single pass actuation assembly that is selectively changeable to provide at least two different focal effects including a first focal effect to provide a first spot area and a second focal effect to provide a second spot area wherein the first and second spot areas are smaller than and fit within the spatial region;

applying the first laser output to the first region to remove material from the spatial region, the first laser output containing at least a first laser pulse that acquires the first focal effect and has a first fluence over the first spot area, and the first fluence being greater than the ablation fluence threshold of the material;

addressing a beam positioner toward a second region selected from the central region or the peripheral region of the spatial region on the workpiece;

causing the single pass actuation assembly to provide the second focal effect that is different from the first focal effect;

generating a second laser output;

propagating the second laser output along the optical path including the single pass actuation assembly;

applying the second laser output to the second region to remove material from the spatial region, the second laser output containing at least a second laser pulse that acquires the second focal effect and has a second fluence over a second spot area, and the second fluence being greater than the ablation fluence threshold of the material and different from the first fluence.

76. The method of claim 75 in which the first region is the central region and the second region is the peripheral region, or in which the first region is the peripheral region and the second region is the central region.

77. The method of claim 76 comprising:

applying the second output prior to addressing the beam positioner toward a first region of a second spatial region on the workpiece wherein the second spatial region is noncontiguous with the first spatial region.

78. The method of claim 76 wherein the fluence applied to the peripheral region is greater than the fluence applied to the central region.

79. The method of claim 78 wherein the material is metal.

80. The method of claim 78 wherein the material is dielectric.

81. The method of claim 76 wherein the material comprises first layer material, wherein the workpiece comprises multiple layers including at least first and second layers of respective first layer and second layer materials having respective first and second ablation fluence thresholds, and wherein the ablation threshold is the first ablation threshold, further comprising:

addressing the beam positioner toward a first addressed region selected from the central region or the peripheral region of the spatial region on the workpiece;

causing the single pass actuation assembly to provide a third focal effect;

generating a third laser output;

propagating the third laser output along the optical path including the single pass actuation assembly to provide the third focal effect to provide a third spot area that is smaller than and fits within the spatial region;

applying the third laser output to the first addressed region to remove second layer material from the spatial region, the third laser output containing at least a third laser pulse that acquires the third focal effect and has a third fluence over the third spot area, and the third fluence being greater than the second ablation fluence threshold and less than first ablation threshold;

addressing a beam positioner toward a second addressed region selected from the central region or the peripheral region of the spatial region on the workpiece;

causing the single pass actuation assembly to provide a fourth focal effect that is different from the third focal effect;

generating a fourth laser output;

propagating the fourth laser output along the optical path including the single pass actuation assembly;

applying the fourth laser output to the second addressed region to remove second layer material from the spatial region, the fourth laser output containing at least a fourth laser pulse that acquires the fourth focal effect and has a fourth fluence over a fourth spot area, and the fourth fluence being greater than the second ablation fluence threshold and less than first ablation threshold and different from the third fluence.

82. The method of claim 81 in which the first addressed region is the central region and the second addressed region is the peripheral region, or in which the first addressed region is the peripheral region and the second addressed region is the central region.

83. The method of claim 82 further comprising:

causing the single pass actuation assembly to switch between providing the first focal effect and the second focal effect in less than 2 ms.

84. The method of claim 83 further comprising:

causing the single pass actuation assembly to switch between providing the first focal effect and the second focal effect in less than 1 ms.

85. The method of claim 82 wherein the single pass actuation assembly comprises a deformable mirror having a mirror surface of a first shape for providing the first focal effect, further comprising:

changing the mirror surface to have a second shape to provide the second the second focal effect.

86. The method of claim 85 further comprising:

applying a voltage to an actuator supporting the mirror surface to switch between the focal effects.

87. The method of claim 86 wherein the actuator comprises an electrostrictive PMN device.

88. The method of claim 85 wherein the deformable mirror has a response time of less than 0.5 ms.

89. The method of claim 82 wherein the single pass actuation assembly comprises distinct first and second focal paths that create the respective first and second focal effects.

90. The method of claim 89 in which a pair of galvanometer mirrors effect switching between the first and second focal paths.

* * * * *

UNITED STATES PATENT AND TRADEMARK OFFICE
CERTIFICATE OF CORRECTION

PATENT NO. : 6,407,363 B2
DATED : June 18, 2002
INVENTOR(S) : Corey M. Dunsky et al.

It is certified that error appears in the above-identified patent and that said Letters Patent is hereby corrected as shown below:

Column 2,
Line 1, "the, workpiece" should read -- the workpiece --.
Line 35, "hole-to hole" should read -- hole-to-hole --.

Column 4,
Line 1, "housing.." should read -- housing. --.
Line 27, "FIG. 15 is fluence" should read -- FIG. 15 is a fluence --.

Column 5,
Line 7, "FIG. 35A and 35B" should read -- FIGS. 35A and 35B --.
Line 26, "10 of the 25 present" should read -- 10 of the present --.
Line 35, "Nd: YAG" should read -- Nd:YAG --.

Column 6,
Line 18, "and-DMM" should read -- and DMM --.

Column 7,
Line 2, "6-9" should read -- 6-9 --.
Line 49, "total a thickness" should read -- total thickness --.

Column 8,
Line 67, "springs116" should read -- springs 116 --.

Column 12,
Line 34, "space-apart" should read -- spaced-apart --.

Column 17,
Line 15, "degree is. increased" should read -- degree is increased --.
Line 40, "FIG. 35A and 35B" should read -- FIGS. 35A and 35B --.
Line 41, "taper 4 for" should read -- taper Φ for --.
Line 46, "is turn off" should read -- is turned off --.

Column 19,
Line 62, "the second the second focal" should read -- the second focal --.

UNITED STATES PATENT AND TRADEMARK OFFICE
CERTIFICATE OF CORRECTION

PATENT NO.    : 6,407,363 B2
DATED         : June 18, 2002
INVENTOR(S)   : Corey M. Dunsky et al.

It is certified that error appears in the above-identified patent and that said Letters Patent is hereby corrected as shown below:

Column 26,
Line 23, "which second spot" should read -- which the second spot --.
Line 64, "claim 59" should read -- claim 57 --.

Column 27,
Line 42, "claim 76 comprising" should read -- claim 76 further comprising --.

Column 28,
Line 49, "the second the second focal" should read -- the second focal --.

Signed and Sealed this

Eighteenth Day of March, 2003

JAMES E. ROGAN
*Director of the United States Patent and Trademark Office*